United States Patent
Leng

(10) Patent No.: US 12,426,281 B2
(45) Date of Patent: Sep. 23, 2025

(54) MULTI-CAPACITOR MODULE INCLUDING A NESTED METAL-INSULATOR-METAL (MIM) STRUCTURE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

(*) Notice: Subject to any disclaimer, the term of this patent is extended or adjusted under 35 U.S.C. 154(b) by 507 days.

(21) Appl. No.: 17/874,482

(22) Filed: Jul. 27, 2022

(65) Prior Publication Data

US 2023/0420495 A1 Dec. 28, 2023

Related U.S. Application Data

(60) Provisional application No. 63/356,068, filed on Jun. 28, 2022.

(51) Int. Cl.
*H10D 1/00* (2025.01)
*H01L 23/522* (2006.01)
*H10D 1/68* (2025.01)

(52) U.S. Cl.
CPC ......... *H10D 1/042* (2025.01); *H01L 23/5223* (2013.01); *H10D 1/692* (2025.01); *H10D 1/716* (2025.01)

(58) Field of Classification Search
CPC ............... H01L 28/90–92; H01L 28/75; H01L 23/5223; H10B 12/038; H10B 12/0387; H10B 12/37; H10D 1/714; H10D 1/716; H10D 1/042; H10D 1/692; H10G 4/012; H10G 4/015
See application file for complete search history.

(56) References Cited

U.S. PATENT DOCUMENTS

| | | | |
|---|---|---|---|
| 6,025,226 A | 2/2000 | Gambino et al. | 438/244 |
| 2002/0030216 A1 | 3/2002 | Adkisson et al. | 257/306 |
| 2004/0056324 A1* | 3/2004 | Ning | H01L 23/5223 257/E21.011 |
| 2007/0152258 A1* | 7/2007 | Kim | H01L 23/5223 257/E21.011 |
| 2010/0230787 A1 | 9/2010 | Guiraud et al. | 257/532 |

(Continued)

OTHER PUBLICATIONS

International Search Report and Written Opinion, Application No. PCT/US2022/053770, 12 pages, Mar. 27, 2023.

*Primary Examiner* — Jose R Diaz
(74) *Attorney, Agent, or Firm* — SLAYDEN GRUBERT BEARD PLLC

(57) ABSTRACT

A multi-capacitor module includes a nested metal-insulator-metal (MIM) structure including a cup-shaped first electrode, a cup-shaped first insulator formed over the cup-shaped first electrode, a cup-shaped second electrode formed over the cup-shaped first insulator, a cup-shaped second insulator formed over the cup-shaped second electrode, and a third electrode formed over the cup-shaped second insulator. The cup-shaped first electrode, the cup-shaped second electrode, and the cup-shaped first insulator define a first capacitor, and the cup-shaped second electrode, the third electrode, and the cup-shaped second insulator define a second capacitor physically nested in the first capacitor.

11 Claims, 16 Drawing Sheets

(56) References Cited

U.S. PATENT DOCUMENTS

| | | | |
|---|---|---|---|
| 2012/0080771 A1* | 4/2012 | Yang | H01L 28/91 |
| | | | 257/532 |
| 2017/0104057 A1 | 4/2017 | Voiron | 257/534 |
| 2022/0069069 A1 | 3/2022 | Leng et al. | |
| 2023/0037867 A1* | 2/2023 | Yang | H10D 1/042 |
| 2023/0071686 A1* | 3/2023 | Verma | H01G 4/33 |

* cited by examiner

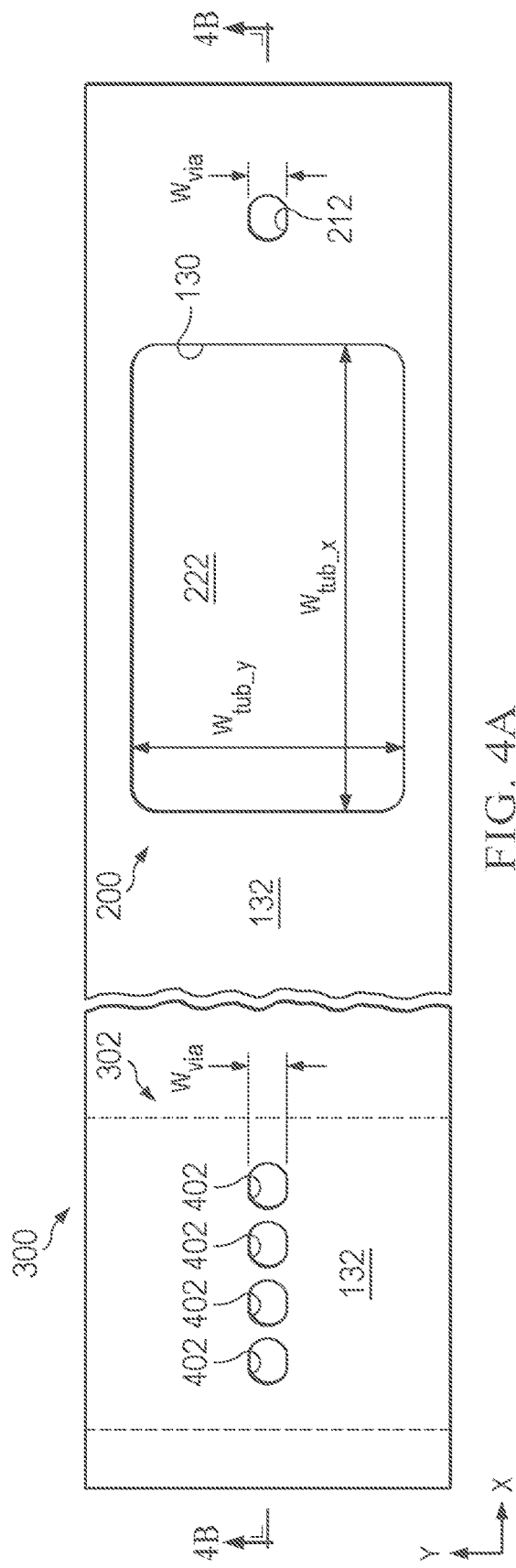
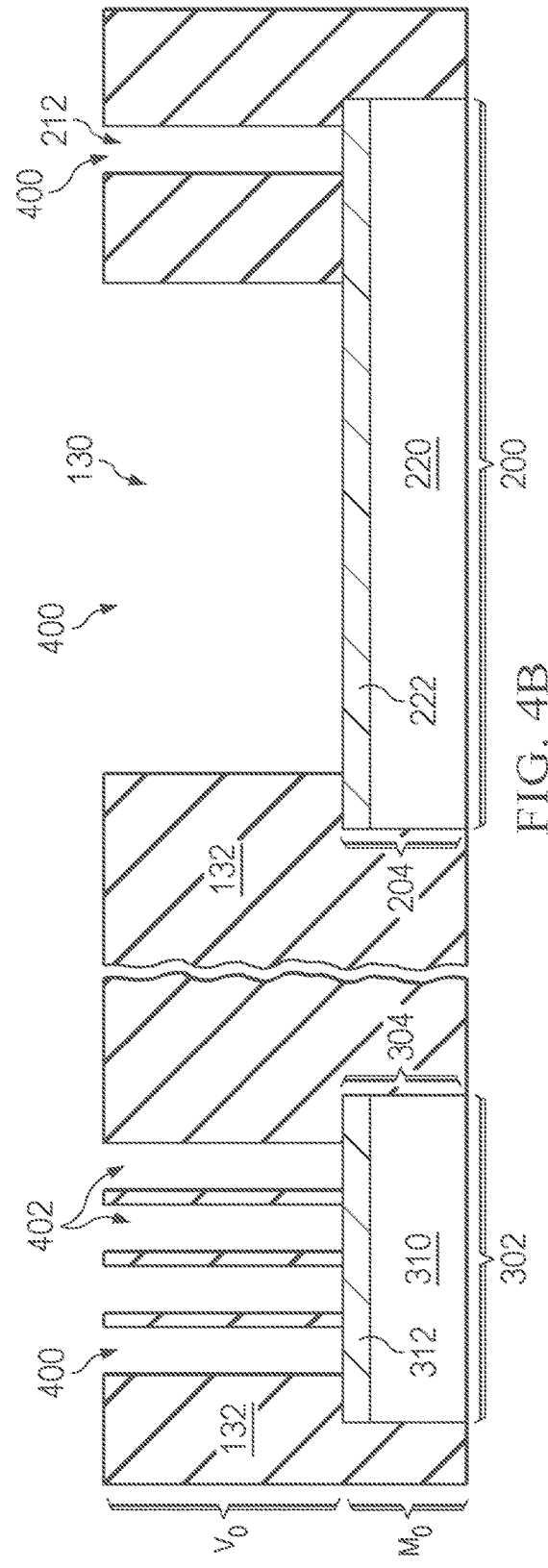
FIG. 4A
FIG. 4B

MULTI-CAPACITOR MODULE INCLUDING A NESTED METAL-INSULATOR-METAL (MIM) STRUCTURE

RELATED PATENT APPLICATION

This application claims priority to commonly owned U.S. Provisional Patent Application No. 63/356,068 filed Jun. 28, 2022, the entire contents of which are hereby incorporated by reference for all purposes.

TECHNICAL FIELD

The present disclosure relates to metal-insulator-metal (MIM) capacitors formed in integrated circuit structures, and more particularly, to a multi-capacitor module including a nested MIM capacitor structure.

BACKGROUND

A MIM capacitor is a capacitor constructed with a metal top electrode, a metal bottom electrode, and an insulator (dielectric) sandwiched between the two electrodes.

MIM capacitors are important components in many electrical circuits, for example many analog, mixed-signal, and radio-frequency complementary metal-oxide semiconductors (RF CMOS) circuits. MIM capacitors often provide better performance than alternatives, such as POP (poly-oxide-poly) capacitors and MOM (metal-oxide-metal lateral flux) capacitors, due to lower resistance, better matching for analog circuits (e.g., matching device characteristics such as resistance and capacitance), and/or better signal/noise ratio.

MIM capacitors are typically constructed between two metal layers (e.g., aluminum interconnect layers), referred to as metal layers $M_x$ and $M_{x+1}$. For example, construction of a conventional MIM capacitor may include forming a bottom electrode (bottom plate) in a metal layer $M_x$, constructing an insulator (dielectric) and a top electrode (top plate) over the bottom electrode, and connecting an overlying metal layer $M_{x+1}$ to the top and bottom electrodes by respective vias. The top electrode formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top electrode may be formed from titanium/titanium nitride (Ti/TiN), tantalum/tantalum nitride (Ta/TaN), or tungsten (W), for example.

Conventional MIM capacitors are relatively expensive to build, requiring one or more additional mask layers to the background fabrication process.

In conventional MIM capacitor design, selecting the thickness of the insulator (dielectric) may involve a trade-off between (a) capacitance value of the MIM capacitor, where capacitance is inversely proportional to the insulator thickness and (b) breakdown voltage, where breakdown voltage is proportional to the insulator thickness.

The conventional MIM capacitor module may suffer from various shortcomings. For example, the thickness of the top electrode may be limited due to a vertical spacing limitation between the two metal layers $M_x$ and $M_{x+1}$, which may result in high serial resistance unsuitable for certain applications (e.g., RF applications).

There is a need for improved MIM capacitor modules and formation processes. For example, there is a need for MIM capacitor modules formed at lower cost and without added mask layers, e.g., as compared with conventional MIM capacitor modules.

SUMMARY

A multi-capacitor module includes a nested metal-insulator-metal (MIM) structure including two or more capacitors formed in a physically nested arrangement. In some examples, the nested MIM capacitor structure includes a series of electrodes and insulators formed in a tub opening in an alternating manner to define two or more nested capacitors.

In some examples, the nested MIM capacitor structure comprises a three-dimensional structure including cup-shaped insulators providing capacitance through both (a) a laterally-extending base of the respective cup-shaped insulator and (b) a vertically-extending sidewall of the respective cup-shaped insulator, to thereby provide a higher capacitance value than conventional plate capacitor devices. In addition, in some examples the nested MIM capacitor structure provides a higher breakdown voltage as compared with conventional capacitor devices.

In some examples, the multi-capacitor module including the nested MIM capacitor structure may be constructed concurrently with an interconnect structure or other IC structure. In some examples, the nested MIM capacitor structure may be constructed using a damascene process without added photomask layers, as compared with a background IC fabrication process.

In some examples, the nested MIM capacitor structure may be constructed between silicided polysilicon layer and a first metal interconnect layer (metal-1), or between a shallow trench isolation (STI) oxide region and a first metal interconnect layer (metal-1), or between two metal interconnect layers at any depth in the relevant IC device structure.

In some examples, a top side of the nested MIM capacitor structure may be sealed by a barrier layer, e.g., comprising silicon nitride (SiN) or silicon carbide (SiC), which may act as an etch stop and also function to terminate edge electric fields generated by the nested MIM capacitor structure.

One aspect provides a multi-capacitor module including a nested MIM structure including a cup-shaped first electrode, a cup-shaped first insulator formed over the cup-shaped first electrode, a cup-shaped second electrode formed over the cup-shaped first insulator, a cup-shaped second insulator formed over the cup-shaped second electrode, and a third electrode formed over the cup-shaped second insulator. The cup-shaped first electrode, the cup-shaped second electrode, and the cup-shaped first insulator define a first capacitor, and the cup-shaped second electrode, the third electrode, and the cup-shaped second insulator define a second capacitor physically nested in the first capacitor.

In some examples, the cup-shaped first insulator is formed in an opening defined by the cup-shaped first electrode, the cup-shaped second electrode is formed in an opening defined by the cup-shaped first insulator, the cup-shaped second insulator is formed in an opening defined by the cup-shaped second electrode, and the third electrode is formed in an opening defined by the cup-shaped second insulator.

In some examples, the multi-capacitor module includes a first electrode base, wherein the nested MIM capacitor structure is formed over the first electrode base and electrically connected to the first electrode base, a vertically-extending first electrode contact electrically connected to the first electrode base, a third electrode connection element electrically connected to the third electrode, and a first electrode connection element electrically connected to the vertically-extending first electrode contact.

In some examples, the first electrode base is formed in a lower metal layer, and the third electrode connection element and the first electrode connection element are formed in an upper metal layer.

In some examples, the lower metal layer comprises a silicided polysilicon layer, wherein the first electrode base comprises a metal silicide region formed on a polysilicon structure. In other examples, the lower metal layer and the upper metal layer respectively comprise metal interconnect layers.

In some examples, the vertically-extending first electrode contact and the cup-shaped first electrode are formed from the same conformal metal.

Another example provides an IC device including an IC structure and a multi-capacitor module. The IC structure includes a lower IC element, an upper IC element formed in an upper metal layer, and a vertically-extending IC contact element formed in a dielectric region and conductively connected between the lower IC element and the upper IC element. The multi-capacitor module includes a nested MIM structure formed in a tub opening in the dielectric region. The nested MIM capacitor structure includes a cup-shaped first electrode, a cup-shaped first insulator formed over the cup-shaped first electrode, a cup-shaped second electrode formed over the cup-shaped first insulator, a cup-shaped second insulator formed over the cup-shaped second electrode, and a third electrode formed over the cup-shaped second insulator. The cup-shaped first electrode, the cup-shaped second electrode, and the cup-shaped first insulator define a first capacitor, and the cup-shaped second electrode, the third electrode, and the cup-shaped second insulator define a second capacitor. The multi-capacitor module also includes a third electrode connection element formed in the upper metal layer, wherein the third electrode connection element is electrically connected to the third electrode.

In some examples, the cup-shaped first insulator is formed in an opening defined by the cup-shaped first electrode, the cup-shaped second electrode is formed in an opening defined by the cup-shaped first insulator, the cup-shaped second insulator is formed in an opening defined by the cup-shaped second electrode, and the third electrode is formed in an opening defined by the cup-shaped second insulator.

In some examples, the IC device includes a first electrode base formed in the lower metal layer, wherein the nested MIM capacitor structure is formed over the first electrode base.

In some examples, the lower metal layer comprises a silicided polysilicon layer, wherein the lower IC element and the first electrode base comprises respective metal silicide regions formed on respective polysilicon structure.

In some examples, the lower metal layer and the upper metal layer comprise respective metal interconnect layers.

In some examples, the nested MIM capacitor structure is formed on a shallow trench isolation (STI) oxide, and the upper metal layer comprises a first metal interconnect layer.

In some examples, the lower IC element comprises a transistor component.

In some examples, the IC device includes a vertically-extending first electrode contact electrically connected to the cup-shaped first electrode, and a first electrode connection element formed in the upper metal layer, wherein the first electrode connection element is electrically connected to the vertically-extending first electrode contact.

In some examples, the IC device includes a first electrode base formed in the lower metal layer, wherein the vertically-extending first electrode contact is electrically connected to the cup-shaped first electrode through the first electrode base.

In some examples, the IC contact element, the vertically-extending first electrode contact, and the cup-shaped first electrode are formed from the same conformal metal.

Another example provides a method including forming a tub opening in a dielectric region, depositing a first conformal metal extending into the tub opening, depositing a first insulator layer extending into an opening defined by the first conformal metal, depositing a second conformal metal extending into an opening defined by the first insulator layer, depositing a second insulator layer extending into an opening defined by the second conformal metal, depositing a third electrode metal extending into an opening defined by the second insulator layer and performing a planarization process defining a nested MIM structure in the tub opening.

In some examples, the planarization process includes removing portions of the first conformal metal, portions of the first insulator layer, portions of the second conformal metal, portions of the second insulator layer, and portions of the third electrode metal. A remaining portion of the first conformal metal defines a cup-shaped first electrode, a remaining portion of the first insulator layer defines a cup-shaped first insulator, a remaining portion of the second conformal metal defines a cup-shaped second electrode, a remaining portion of the second insulator layer defines a cup-shaped second insulator, and a remaining portion of the third electrode metal defines a third electrode. The cup-shaped first electrode, the cup-shaped second electrode, and the cup-shaped first insulator define a first capacitor, and the cup-shaped second electrode, the third electrode, and the cup-shaped second insulator define a second capacitor.

In some examples, the method includes forming a first electrode base in a lower metal layer, forming the dielectric region over the lower metal layer, wherein the tub opening is formed over the first electrode base, and forming a third electrode connection element in an upper metal layer over the dielectric region, wherein the third electrode connection element is electrically connected to the third electrode.

In some examples, the lower metal layer comprises a silicided polysilicon layer, wherein the first electrode base comprises a metal silicide region formed on a polysilicon structure.

In some examples, the lower metal layer and upper metal layer comprise respective metal interconnect layers.

In some examples, the method includes forming a first electrode contact opening in the dielectric region, wherein the deposited first conformal metal extends into the first electrode contact opening, wherein after the planarization process, a remaining portion of the first conformal metal in the first electrode contact opening defines a first electrode contact electrically connected to the first electrode base, and forming a first electrode connection element in the upper metal layer, wherein the first electrode connection element is electrically connected to the first electrode contact.

In some examples, the method includes forming the dielectric region over a shallow trench isolation (STI) oxide, wherein the tub opening exposes an upper surface of the STI oxide, and wherein the first conformal metal is deposited on the exposed upper surface of the STI oxide.

In some examples, the method includes forming a first electrode base and a lower integrated circuit (IC) element in a lower metal layer, wherein the dielectric region is formed over the lower metal layer, forming an IC contact element opening in the dielectric region, wherein the deposited first conformal metal fills the IC contact element opening, wherein a portion of the first conformal metal in the IC contact element opening after the planarization process defines an IC contact element, wherein after the planarization process, a remaining portion of the first conformal metal in the IC contact element opening defines a vertically-extending IC contact element electrically connected to the lower IC element, and forming an upper IC element and a third electrode connection in the upper metal layer, wherein the upper IC element is electrically connected to the vertically-extending IC contact element, and wherein the third electrode connection element is electrically connected to the third electrode.

BRIEF DESCRIPTION OF THE DRAWINGS

Example aspects of the present disclosure are described below in conjunction with the figures, in which:

FIGS. 4A-4L show an example method of forming the example IC device shown in FIG. 3, including the example multi-capacitor module and a separate IC structure;

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
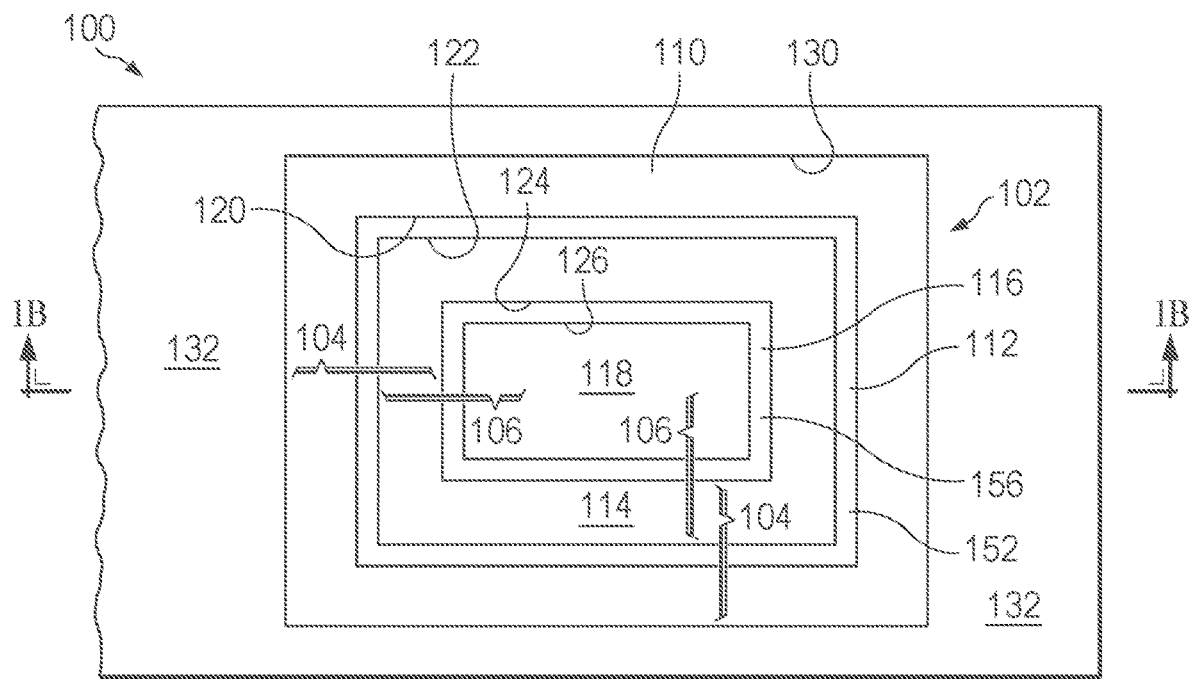
FIG. 1A is a top view and FIG. 1B is a cross-sectional side view of an example multi-capacitor module including a nested metal-insulator-metal (MIM) structure.
Figure 1B:
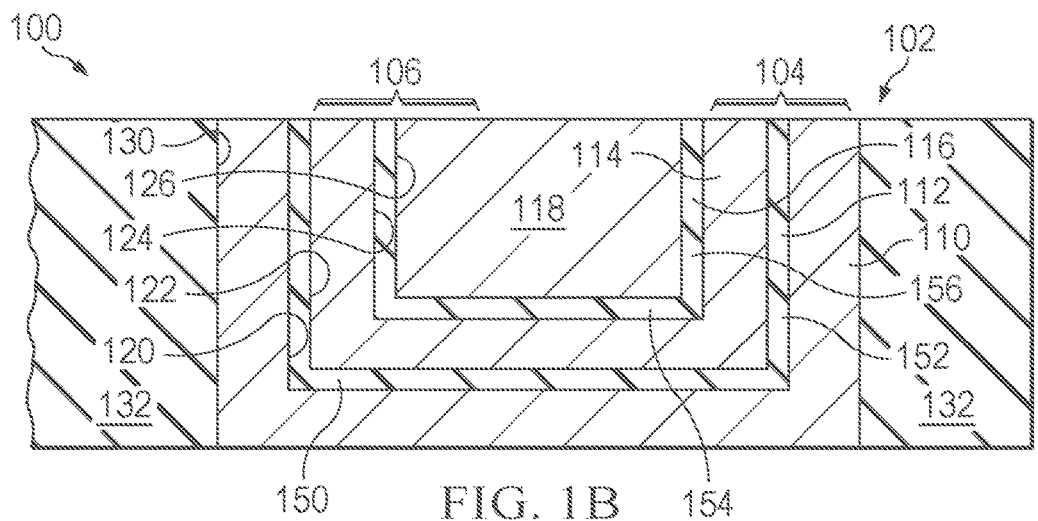

FIG. 1A is a top view and FIG. 1B is a cross-sectional side view (through line 1B-1B shown in FIG. 1A) of an example multi-capacitor module 100 including a nested MIM capacitor structure 102, according to one example. In this example the nested MIM capacitor structure 102 defines a first capacitor 104 and a second capacitor 106 physically arranged in a nested manner and electrically connected in series. Thus, the example multi-capacitor module 100 is a two-capacitor module (or dual-capacitor module). In other examples multi-capacitor module 100 may include three, four, or more capacitors physically arranged in a nested manner and electrically connected in series.

As shown in FIGS. 1A and 1B, the example nested MIM capacitor structure 102 includes a cup-shaped first electrode 110, a cup-shaped first insulator 112 formed over the cup-shaped first electrode 110, a cup-shaped second electrode 114 formed over the cup-shaped first insulator 112, a cup-shaped second insulator 116 formed over the cup-shaped second electrode 114, and a third electrode 118 formed over the cup-shaped second insulator 116. In this example, the cup-shaped first insulator 112 is formed in an opening 120 defined by the cup-shaped first electrode 110, the cup-shaped second electrode 114 is formed in an opening 122 defined by the cup-shaped first insulator 112, the cup-shaped second insulator 116 is formed in an opening 124 defined by the cup-shaped second electrode 114, and the third electrode 118 is formed in an opening 126 defined by the cup-shaped second insulator 116.

In some examples, the nested MIM capacitor structure 102 is formed in an opening 130 (referred to herein as tub opening 130) in a dielectric region 132, for example a poly-metal dielectric region (PMD) or an inter-metal dielectric region (IMD), as discussed below.

In the illustrated example, the cup-shaped first electrode 110, the cup-shaped second electrode 114, and the cup-shaped first insulator 112 arranged between the cup-shaped first electrode 110 and cup-shaped second electrode 114 define the first capacitor 104. The cup-shaped second electrode 114, the third electrode 118, and the cup-shaped second insulator 116 arranged between the cup-shaped second electrode 114 and the third electrode 118 define the second capacitor 106. As shown, the second capacitor 106 is physically "nested" within in the first capacitor 104, and the first and second capacitors 104 and 106 are electrically connected in series.

Figure 1C:
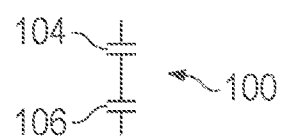
FIG. 1C shows is an electrical schematic of the example multi-capacitor module of FIGS. 1A and 1B, showing the two capacitors of the example multi-capacitor module arranged in series.

FIG. 1C is an electrical schematic of the example multi-capacitor module 100 of FIGS. 1A and 1B, showing the first capacitor 104 and second capacitor 106 capacitors arranged in series.

In some examples, the example multi-capacitor module 100 may be formed by a process that adds no additional masks to the background/baseline IC fabrication process. In some examples, the example multi-capacitor module 100 may be formed using a damascene fabrication process, e.g., as shown in the FIGS. 4A-4L discussed below.

As shown in FIG. 1B, the cup-shaped first insulator 112 may include a laterally-extending first insulator base 150 and a vertically-extending first insulator sidewall 152 extending upwardly from the laterally-extending first insulator base 150, and the cup-shaped second insulator 116 may include a laterally-extending second insulator base 154 and a vertically-extending second insulator sidewall 156 extending upwardly from the laterally-extending second insulator base 154. In some examples, the total capacitance of the example multi-capacitor module 100 may be greater than a conventional planar MIM capacitor having a similar lateral footprint due to additional capacitive coupling through the vertically-extending sidewalls 152 and 156 of the cup-shaped first insulator 112 and cup-shaped second insulator 116, respectively.

In addition, as compared with single-capacitor modules, e.g., a single capacitor MIM capacitor, the example multi-capacitor module 100 may have an increased breakdown voltage, for example up to 100% greater, because the first and second capacitors 104 and 106 connected in series behave as a voltage divider.

Figure 2A:
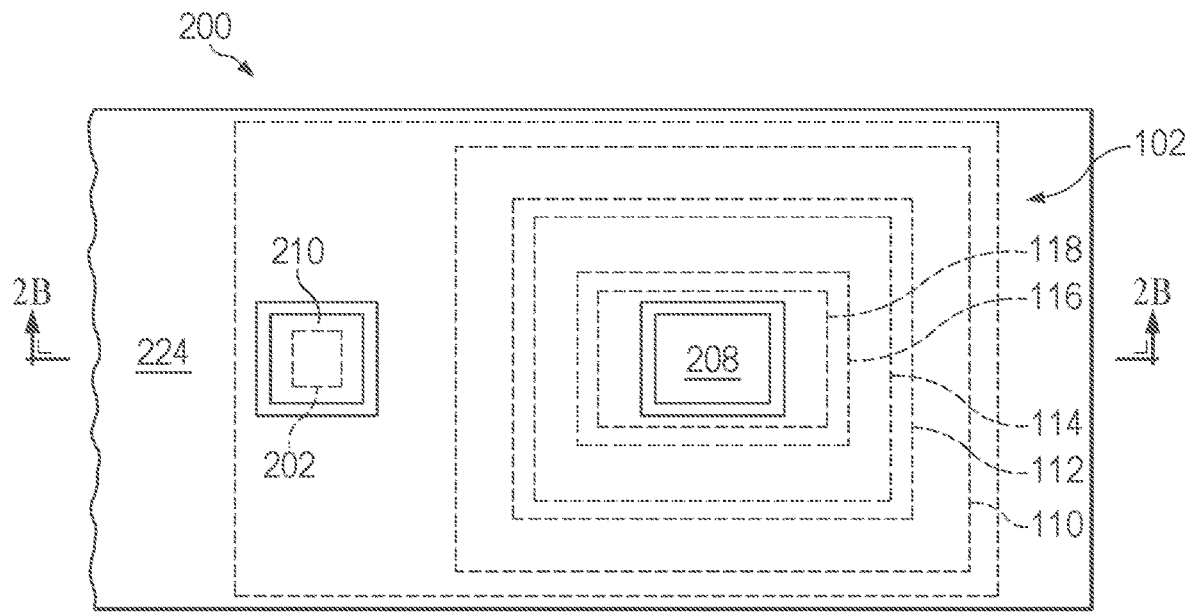
FIG. 2A is a top view and FIG. 2B is a cross-sectional side view of an example multi-capacitor module including a nested MIM capacitor structure and associated contact structures, according to one example.
Figure 2B:
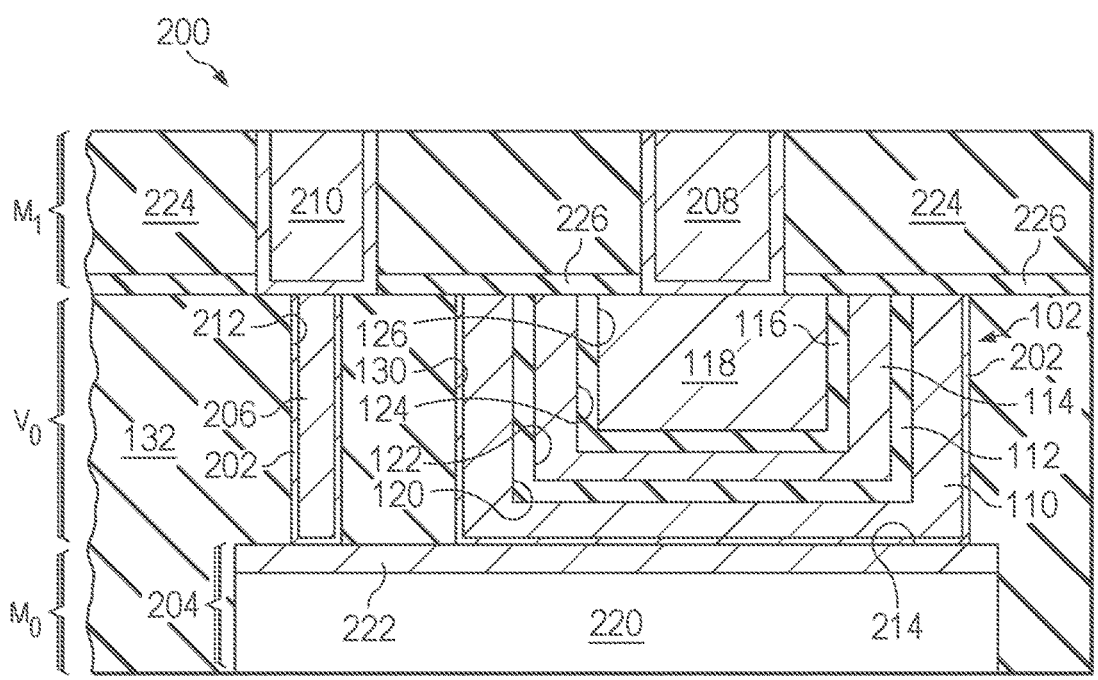

FIG. 2A is a top view and FIG. 2B is a cross-sectional side view (through line 2B-2B shown in FIG. 2A) of an example multi-capacitor module 200 including the nested MIM capacitor structure 102 shown in FIGS. 1A and 1B, according to one example. As discussed above, nested MIM capacitor structure 102 includes cup-shaped first electrode 110, cup-shaped first insulator 112 formed in opening 120 defined by the cup-shaped first electrode 110, cup-shaped second electrode 114 formed in opening 122 defined by the cup-shaped first insulator 112, cup-shaped second insulator 116 formed in opening 124 defined by the cup-shaped second electrode 114, and third electrode 118 formed in opening 126 defined by the cup-shaped second insulator 116. In some examples, the cup-shaped first electrode 110 is formed over a liner (or "glue layer") 202, e.g., comprising TiN with a thickness in the range of 50 Å-200 Å.

The example multi-capacitor module 200 also includes a first electrode base 204 formed in a lower metal layer $M_0$, a third electrode connection element 208 and a first electrode connection element 210 formed in an upper metal layer $M_1$, and a vertically-extending first electrode contact 206 extending vertically between the first electrode base 204 and the first electrode connection element 210.

As shown, the nested MIM capacitor structure 102 is formed over a first area of the first electrode base 204 and electrically connected to the first electrode base 204. For example, as discussed below with reference to FIG. 4C, liner 202 may be deposited in the tub opening 130 and directly on an upper surface 214 of the first electrode base 204, followed by deposition of a first conformal metal forming the cup-shaped first electrode 110, a first insulator layer forming the cup-shaped first insulator 112, a second conformal metal forming the cup-shaped second electrode 114, a second insulator layer forming the cup-shaped second insulator 116, and a third electrode metal forming the third electrode 118.

As shown, the vertically-extending first electrode contact 206 may be formed in a first electrode contact opening 212 located over a second area of the first electrode base 204 (e.g., spaced laterally apart from the first area of the first electrode base 204 over which the nested MIM capacitor structure 102 is formed), and electrically connected to the first electrode base 204. Thus, the vertically-extending first electrode contact 206 is electrically connected to the cup-shaped first electrode 110 through the first electrode base 204 (and through the liner 202). In some examples, e.g., as discussed below with reference to FIGS. 4A-4C, the vertically-extending first electrode contact 206 and the cup-shaped first electrode 110 may be formed concurrently from the same conformal metal, e.g., by depositing tungsten or other conformal metal in respective openings in the dielectric region 132.

The first electrode base 204 formed in the lower metal layer $M_0$ may comprise a conductive structure providing an electrical connection between the vertically-extending first electrode contact 206 and the cup-shaped first electrode 110. The lower metal layer $M_0$ may comprise a silicided polysilicon layer formed below a first metal interconnect layer $M_1$ (or "metal-1") in which first metal interconnect layer $M_1$ the third electrode connection element 208 and first electrode connection element 210 are formed. Accordingly, the first electrode base 204 may comprise a silicided polysilicon structure including a polysilicon region 220 having a metal silicide layer region 222 (e.g., comprising titanium silicide, cobalt silicide, or nickel silicide) formed thereon.

Figure 6:
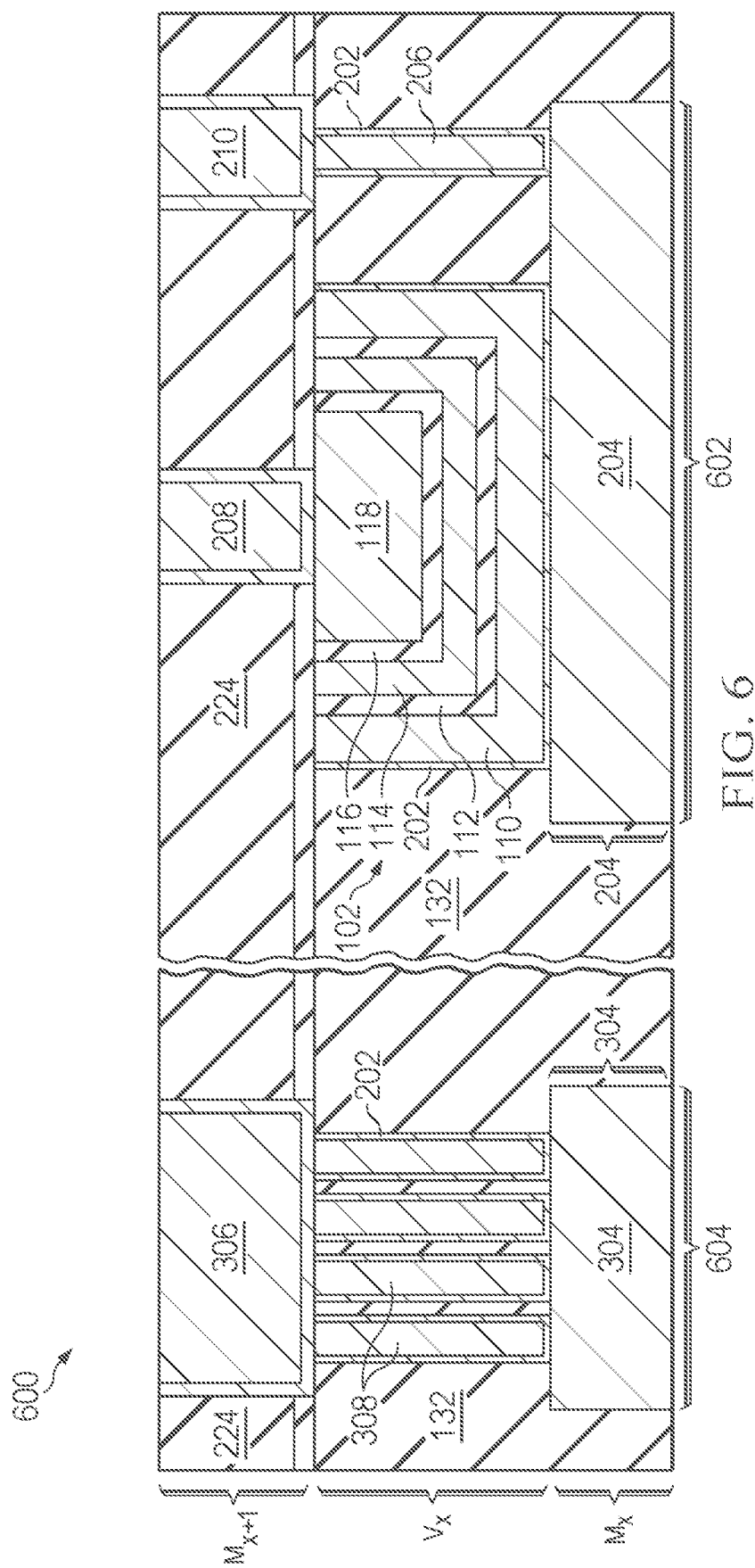
FIG. 6 is a cross-sectional side view of an IC device including an example multi-capacitor module including a nested MIM capacitor structure, and an example interconnect structure, formed between two metal interconnect layers.

In other examples, e.g., as shown in FIG. 6 discussed below, the first electrode base 204 may be formed in a lower interconnect metal layer $M_x$ (wherein the first electrode base 204 comprises an aluminum or copper element, for example), and the third electrode connection element 208 and first electrode connection element 210 may be formed in an upper interconnect metal layer $M_{x+1}$ at any depth in the respective IC device structure.

Figure 5A:
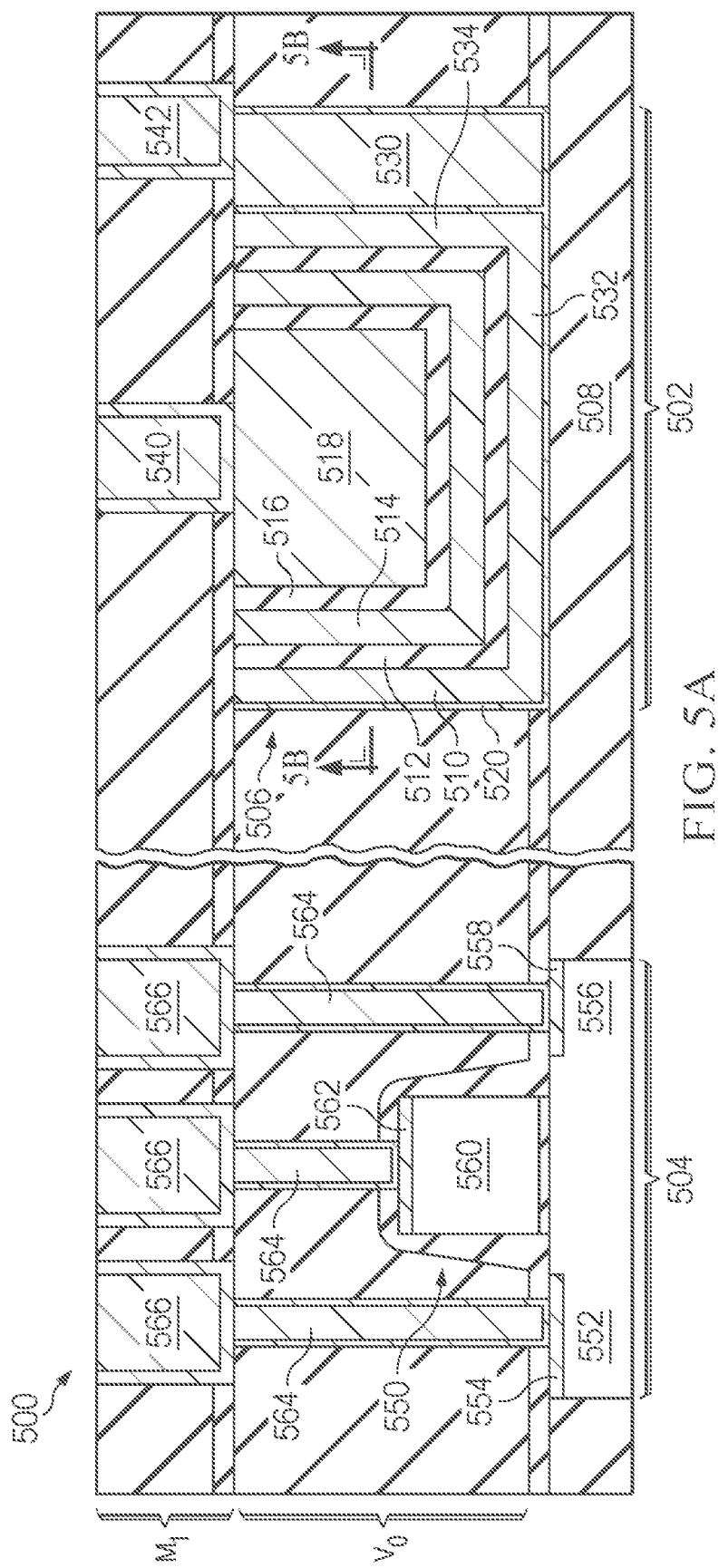
FIG. 5A is a cross-sectional side view of an IC device including an example multi-capacitor module including a nested MIM capacitor structure, and an example IC structure, formed between a shallow trench isolation (STI) oxide region and a first metal interconnect layer.
Figure 5B:
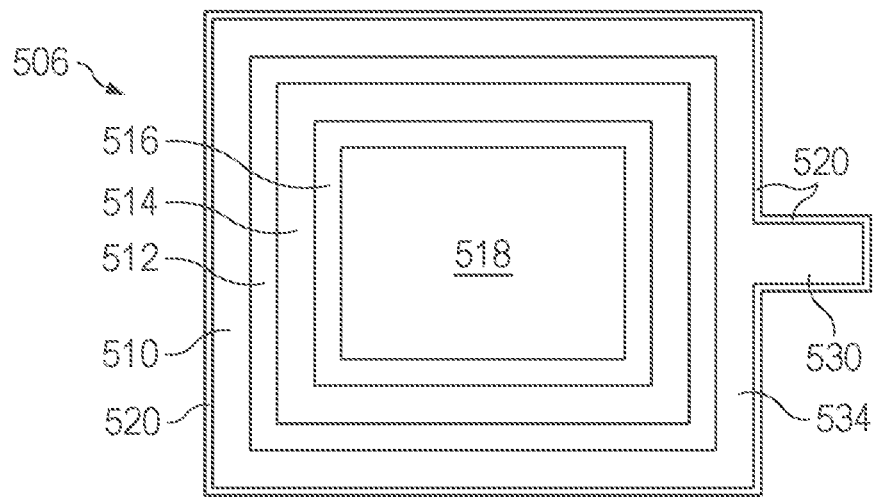
FIG. 5B is a cross-sectional top view through cut line 5B-5B shown in FIG. 5A, showing the nested MIM capacitor structure of the IC device shown in FIG. 5A.

In still other examples, e.g., as shown in FIGS. 5A and 5B discussed below, the nested MIM capacitor structure 102 may be formed directly on a shallow trench isolation (STI) oxide layer, e.g., omitting the first electrode base 204.

Returning to the example shown in FIGS. 2A-2B, the third electrode connection element 208 is electrically connected to the third electrode 118, and first electrode connection element 210 is electrically connected to the vertically-extending first electrode contact 206. As mentioned above, the third electrode connection element 208 and first electrode connection element 210 may be formed in a first metal interconnect layer $M_1$ (metal-1). In some examples, e.g., as discussed below with reference to FIGS. 4J-4L, the third electrode connection element 208 and first electrode connection element 210 may comprise metal elements (e.g., comprising copper or other suitable metal) formed in a dielectric layer 224 using a damascene process.

In some examples, an etch stop layer 226 (e.g., comprising silicon nitride (SiN) or silicon carbide (SiC) with a thickness in the range of 250-750 Å) is formed over the nested MIM capacitor structure 102 and vertically-extending first electrode contact 206. The etch stop layer 226 may act as an etch stop for forming respective openings in the dielectric layer 224 for forming the third electrode connection element 208 and first electrode connection element 210. The etch stop layer 226 may also function to terminate fringe electric fields generated at the top side of the nested MIM capacitor structure 102.

Figure 3:
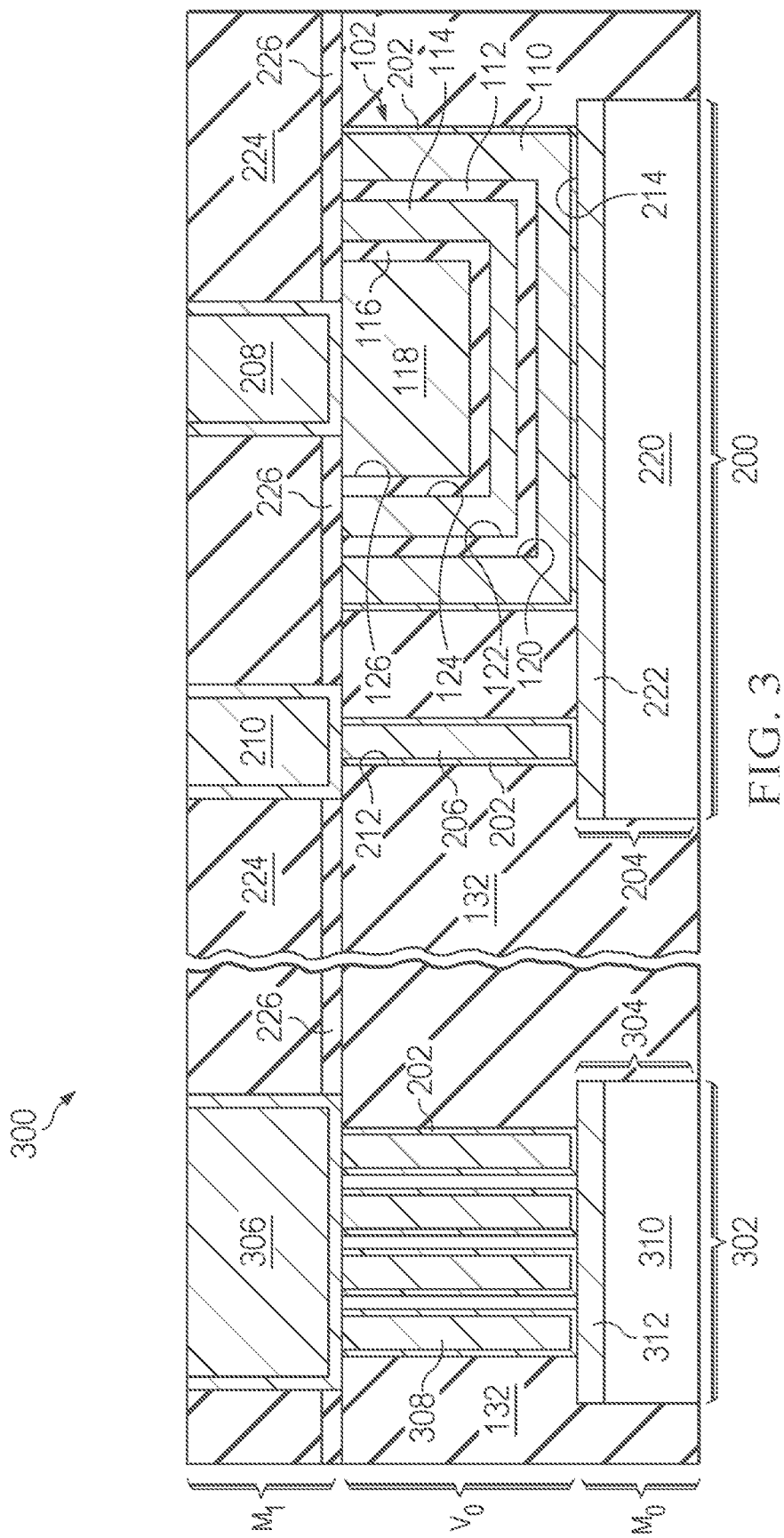
FIG. 3 is a cross-sectional side view of an example IC device including the multi-capacitor module of FIGS. 2A and 2B and a separate IC structure, which may be formed concurrently, according to one example.

FIG. 3 is a cross-sectional side view of an IC device 300 including the example multi-capacitor module 200 of FIGS. 2A-2B formed concurrently with an example IC structure 302. In some examples, the example multi-capacitor module 200 may be constructed without adding any photomask operations to the background integrated circuit fabrication process (e.g., the background integrated circuit fabrication process for forming the IC structure 302 and/or other IC elements).

As discussed above, the example multi-capacitor module 200 includes nested MIM capacitor structure 102, first electrode base 204 formed in a lower metal layer $M_0$, third electrode connection element 208 and first electrode connection element 210 formed in upper metal layer $M_1$, and vertically-extending first electrode contact 206 extending vertically between the first electrode base 204 and the first electrode connection element 210. As discussed above, nested MIM capacitor structure 102 includes cup-shaped first electrode 110, cup-shaped first insulator 112 formed in opening 120 defined by the cup-shaped first electrode 110, cup-shaped second electrode 114 formed in opening 122 defined by the cup-shaped first insulator 112, cup-shaped second insulator 116 formed in opening 124 defined by the cup-shaped second electrode 114, and third electrode 118 formed in opening 126 defined by the cup-shaped second insulator 116.

The example IC structure 302 may comprise a lower IC element 304 formed in the lower metal layer $M_0$, an upper IC element 306 formed in the upper metal layer $M_1$, and at least one vertically-extending IC contact element 308 formed in dielectric region 132 and conductively connected between the lower IC element 304 and the upper IC element 306. Respective vertically-extending IC contact elements 308 may be formed over liner 202 (e.g., TiN liner). Lower IC element 304 (similar to first electrode base 204) may comprise a silicided polysilicon structure including a polysilicon region 310 having a metal silicide layer region 312 (e.g., comprising titanium silicide, cobalt silicide, or nickel silicide) formed thereon. In other examples, lower IC element 304 may comprise a transistor component or other active element (e.g., as shown in FIGS. 5A and 5B discussed below) or a metal interconnect element (e.g., as shown in FIG. 6 discussed below).

The lower IC element 304 and first electrode base 204 may be formed concurrently in lower metal layer $M_0$, e.g., as discussed below with reference to FIG. 4A. The upper IC element 306, third electrode connection element 208, and first electrode connection element 210 may be formed concurrently in upper metal layer $M_1$, e.g., using a damascene process as discussed below with reference to FIGS. 4J-4L. The vertically-extending IC contact element 308, cup-shaped first electrode 110, and vertically-extending first electrode contact 206 may be formed in via layer $V_0$ (often referred to as a contact layer) between lower metal layer $M_0$ and upper metal layer $M_1$, e.g., using a damascene process as discussed below with respect to FIGS. 4A-4I.

FIGS. 4A-4L show an example method of forming the example IC device 300 shown in FIG. 3, including example multi-capacitor module 200 and example IC structure 302. In some other examples, the IC structure 302 may be omitted, such that the multi-capacitor module 200 may be formed by the process described below without the elements of IC structure 302. In the example shown in FIGS. 4A-4L, the multi-capacitor module 200 is formed between a silicided polysilicon layer $M_0$ and a first metal interconnect layer $M_1$ (metal-1).

As shown in FIG. 4A (top view) and FIG. 4B (cross-sectional side view through line 4B-4B shown in FIG. 4A), the lower IC element 304 and first electrode base 204 are formed in lower metal layer $M_0$. In this example, the lower metal layer $M_0$ comprises a silicided polysilicon layer, wherein the lower IC element 304 comprises polysilicon structure 310 having metal silicide region 312 formed thereon, and the first electrode base 204 comprises polysilicon structure 220 having metal silicide region 222 formed thereon.

Dielectric region 132 (e.g., a poly metal dielectric (PMD) region) is formed over the lower IC element 304 and first electrode base 204 formed in lower metal layer $M_0$. In some examples, dielectric region 132 may comprise silicon oxide, PSG (phosphosilicate glass), or a combination thereof.

As shown in FIGS. 4A and 4B, dielectric region openings 400, including IC contact element openings 402, tub opening 130, and first electrode contact opening 212, are formed in dielectric region 132. Dielectric region openings 400 may be formed by masking with photoresist material and using a plasma etch or other suitable etch, followed by a resist strip or other suitable process to remove remaining portions of photoresist material. The etch process to form dielectric region openings 400 may be a selective etch that stops on the metal silicide region 312 of the lower IC element 304 and the metal silicide region 222 of the first electrode base 204.

In some examples, IC contact element openings 402 may be via openings (often referred to as contact openings) having a width (or diameter or Critical Dimension (CD)) $W_{via}$ in both the x-direction and y-direction in the range of 0.1-0.5 μm, for example. First electrode contact opening 212 may also be a via opening, e.g., having a width $W_{eco}$ in both the x-direction and y-direction in the range of 0.1-0.5 μm, for example. In other examples, the width $W_{eco}$ of first electrode contact opening 212 may have other suitable dimensions.

In contrast, tub opening 130 may have a substantially larger width in the x-direction ($W_{tub\_x}$) and/or y-direction ($W_{tub\_y}$) than IC contact element openings 402 and first electrode contact opening 212. The shape and dimensions of the tub opening 130 may be selected based on various parameters, e.g., for effective manufacturing of the multi-capacitor module 200 (e.g., effective formation of the nested MIM capacitor structure 102 in the tub opening 130) and/or for desired performance characteristics of the resulting multi-capacitor module 200. In one example, e.g., as shown in FIG. 4B, the tub opening 130 may have a square or rectangular shape from the top view. In other examples, tub opening 130 may have a circular or oval shape from the top view.

As noted above, a width of tub opening 130 in the x-direction ($W_{tub\_x}$) y-direction ($W_{tub\_y}$), or both the x-direction and y-direction ($W_{tub\_x}$ and $W_{tub\_y}$) may be substantially larger than the width $W_{via}$ of IC contact element openings 402 in the x-direction, y-direction, or both the x-direction and y-direction. For example, in some examples, width $W_{tub\_x}$ and $W_{tub\_y}$ of tub opening 130 are respectively at least twice as large as the width $W_{via}$ of IC contact element openings 402. In particular examples, width $W_{tub\_x}$ and $W_{tub\_y}$ of tub opening 130 are respectively at least five time as large or at least 10 times as large as the width $W_{via}$ of IC contact element openings 402. In some examples, $W_{tub\_x}$ and $W_{tub\_y}$ are respectively in the range of 1-100 μm.

Further, tub opening 130 may be formed with a height-to-width aspect ratio of less than or equal to 1.0 in both the x-direction and y-direction, e.g., to allow effective filling of the tub opening 130 by respective materials. For example, tub opening 130 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of tub opening 130 by respective materials to form nested MIM capacitor structure 102 in the tub opening 130. For example, tub opening 130 may be formed with aspect ratios $H_{tub}/W_{tub\_x}$ and $H_{tub}/W_{tub\_y}$ respectively in the range of 0.1-1.0, or more particularly in the range of 0.5-1.0.

Figure 4C:
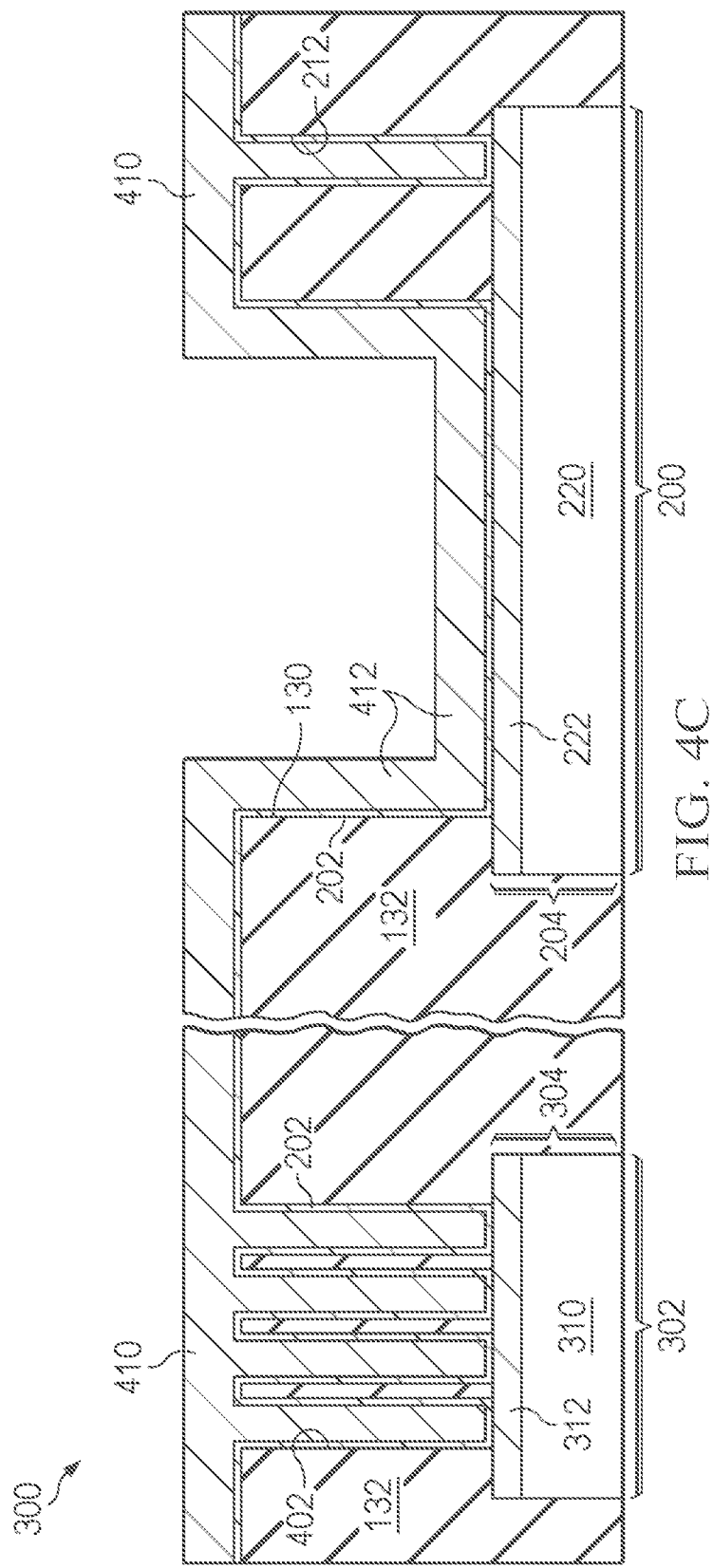

As shown in FIG. 4C, liner (or "glue layer") 202, e.g., comprising TiN with a thickness which may be in the range of 50 Å-200 Å, is deposited over the structure and extends into respective dielectric region openings 400. A first conformal metal 410 is deposited over the liner 202 and extends into respective via layer openings 400 to (a) fill IC contact element openings 402, (b) fill first electrode contact opening 212, and (c) form a first electrode cup structure 412 in the tub opening 130, the first electrode cup structure 412 including a laterally-extending first electrode base and a vertically-extending first electrode sidewall extending upwardly from the laterally-extending first electrode base, e.g., from a perimeter of laterally-extending first electrode base. In one example, the first conformal metal 410 comprises tungsten deposited with a thickness in the range of 1000 Å-5000 Å. In other examples, the first conformal metal 410 may comprise Co, TiN, or other conformal metal. The first conformal metal 410 may be deposited by a conformal chemical vapor deposition (CVD) process or other suitable deposition process.

Figure 4D:
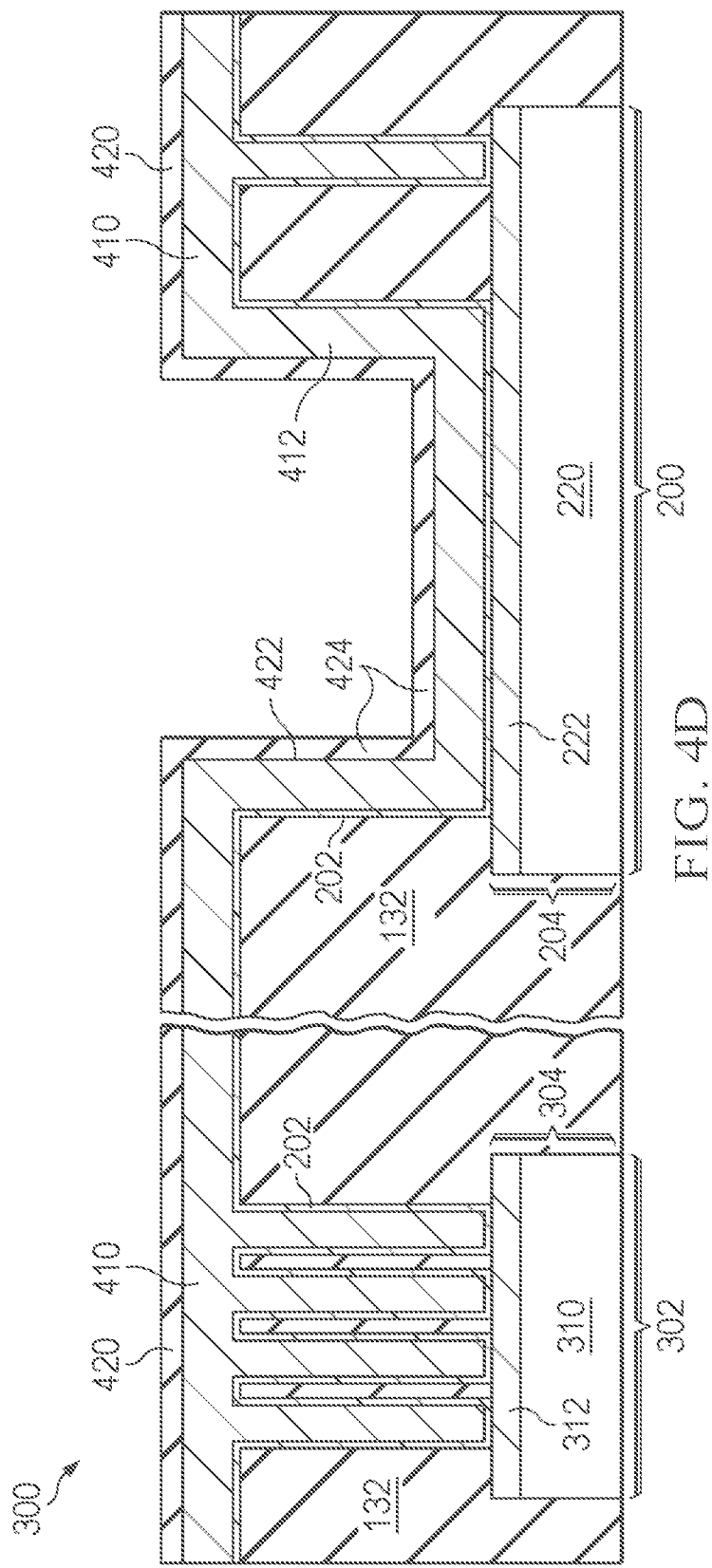

As shown in FIG. 4D, a first insulator layer 420 is deposited over the first conformal metal 410 and extends down into an opening 422 defined by the first electrode cup structure 412 to form a first insulator cup structure 424 including a laterally-extending first insulator base and a vertically-extending first insulator sidewall extending upwardly from the laterally-extending first insulator base, e.g., from a perimeter of laterally-extending first insulator base. In some examples, the first insulator layer 420 comprises silicon nitride (SiN) deposited with a thickness in the range of 250 Å-750 Å by a Plasma Enhanced Chemical Vapor Deposition (PECVD) process. Alternatively, the first insulator layer 420 may comprise $Al_2O_3$, $ZrO_2$, $HfO_2$, $ZrSiO_x$, $HfSiO_x$, HfAlOx, or Ta2O5, or other suitable capacitor insulator material deposited using an Atomic Layer Deposition (ALD) process.

Figure 4E:
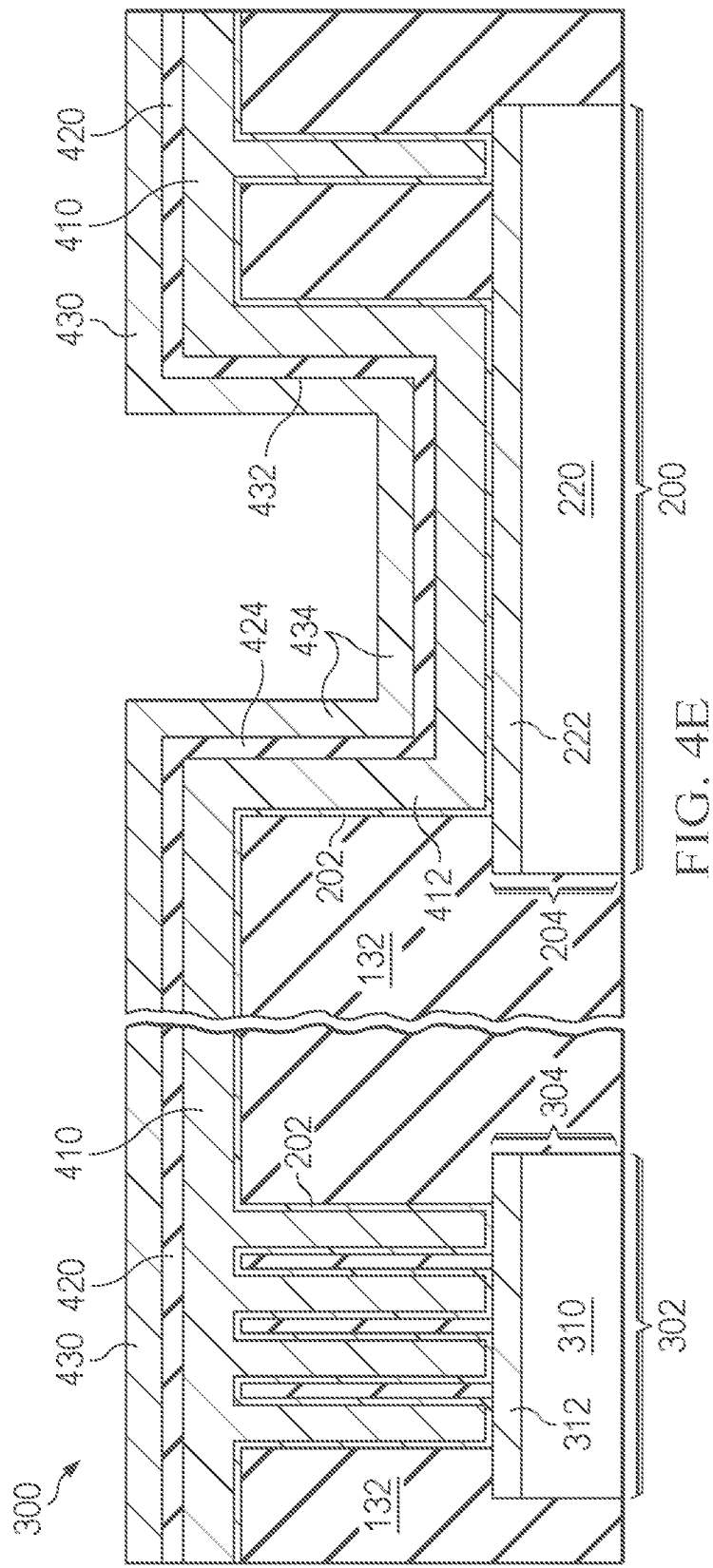

As shown in FIG. 4E, a second conformal metal 430 is deposited over the first insulator layer 420 and extends down into an opening 432 defined by the first insulator cup structure 424 to form a second electrode cup structure 434 including a laterally-extending second electrode base and a vertically-extending second electrode sidewall extending upwardly from the laterally-extending second electrode base, e.g., from a perimeter of laterally-extending second electrode base. In some examples, the second conformal metal 430 comprises a metal or metals that counteracts physical stresses associated with the first conformal metal 410. For example, where the first conformal metal 410 comprises tungsten, which inherently includes high tensile stresses, the second conformal metal 430 may comprise TiN, which inherently includes high compressive stresses (e.g., for a layer thickness less than 1 µm). Thus, in some examples, the second conformal metal 430 may comprise TiN or TiN combined with tungsten, deposited with a thickness in the range of 1000 Å-5000 Å, for example by CVD or physical vapor deposition (PVD), for example. The compressive stresses of the TiN of the second conformal metal 430 may counteract or balance the tensile stresses of tungsten of the first conformal metal 410, which may prevent or reduce the likelihood of layer peeling or breakage of the underlying silicon wafer. In other examples, the second conformal metal 430 may comprise tungsten or other refractory metal(s).

Figure 4F:
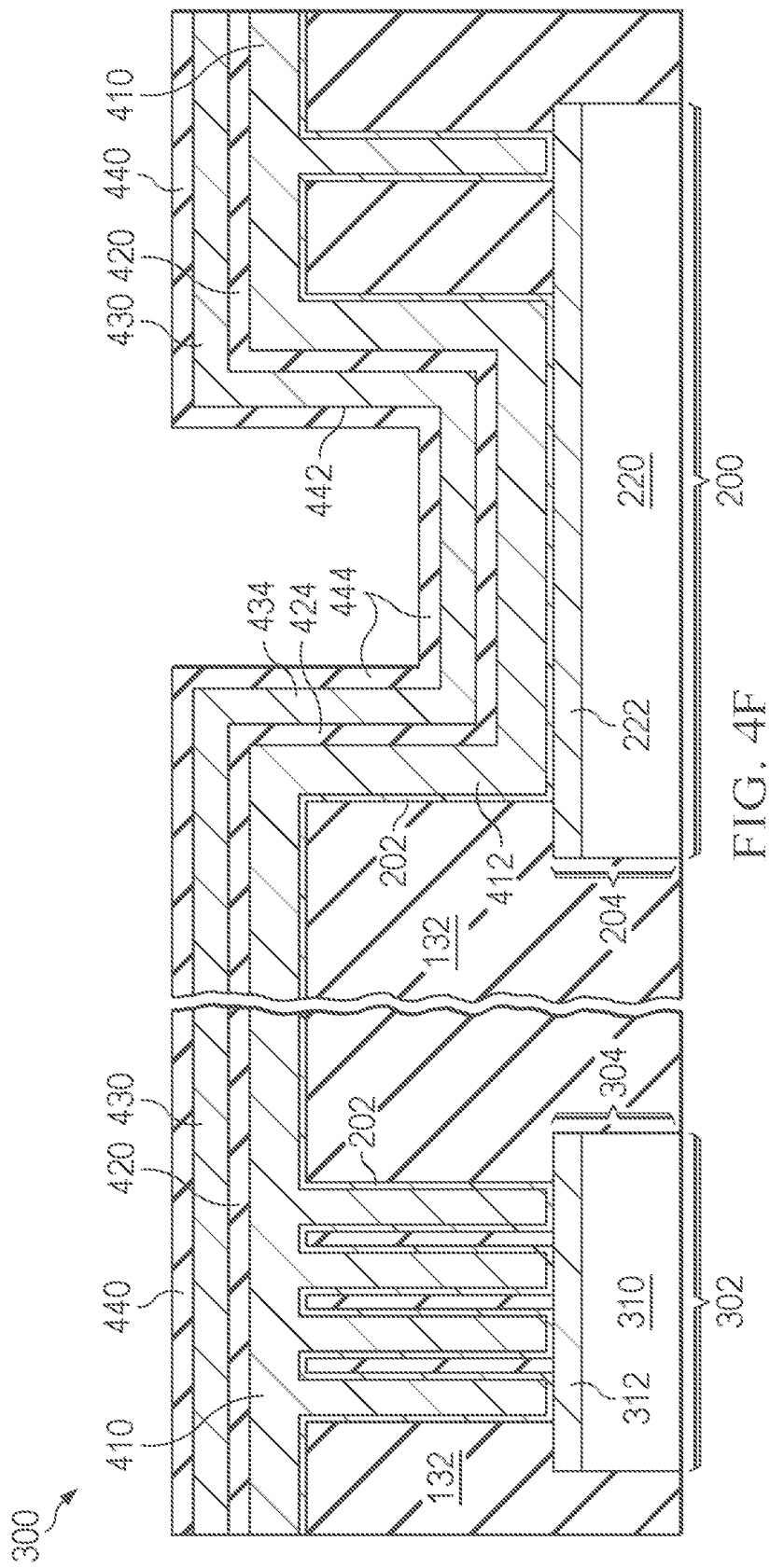

As shown in FIG. 4F, a second insulator layer 440 is deposited over the second conformal metal 430 and extends down into an opening 442 defined by the second electrode cup structure 434 to form a second insulator cup structure 444 including a laterally-extending second insulator base and a vertically-extending second insulator sidewall extending upwardly from the laterally-extending second insulator base, e.g., from a perimeter of laterally-extending second insulator base. In some examples, the second insulator layer 440 comprises SiN deposited with a thickness in the range of 250 Å-750 Å by a PECVD process. Alternatively, the second insulator layer 440 may comprise $Al_2O_3$, $ZrO_2$, $HfO_2$, $ZrSiO_x$, $HfSiO_x$, HfAlOx, or Ta2O5, or other suitable capacitor insulator material deposited using an ALD process.

Figure 4G:
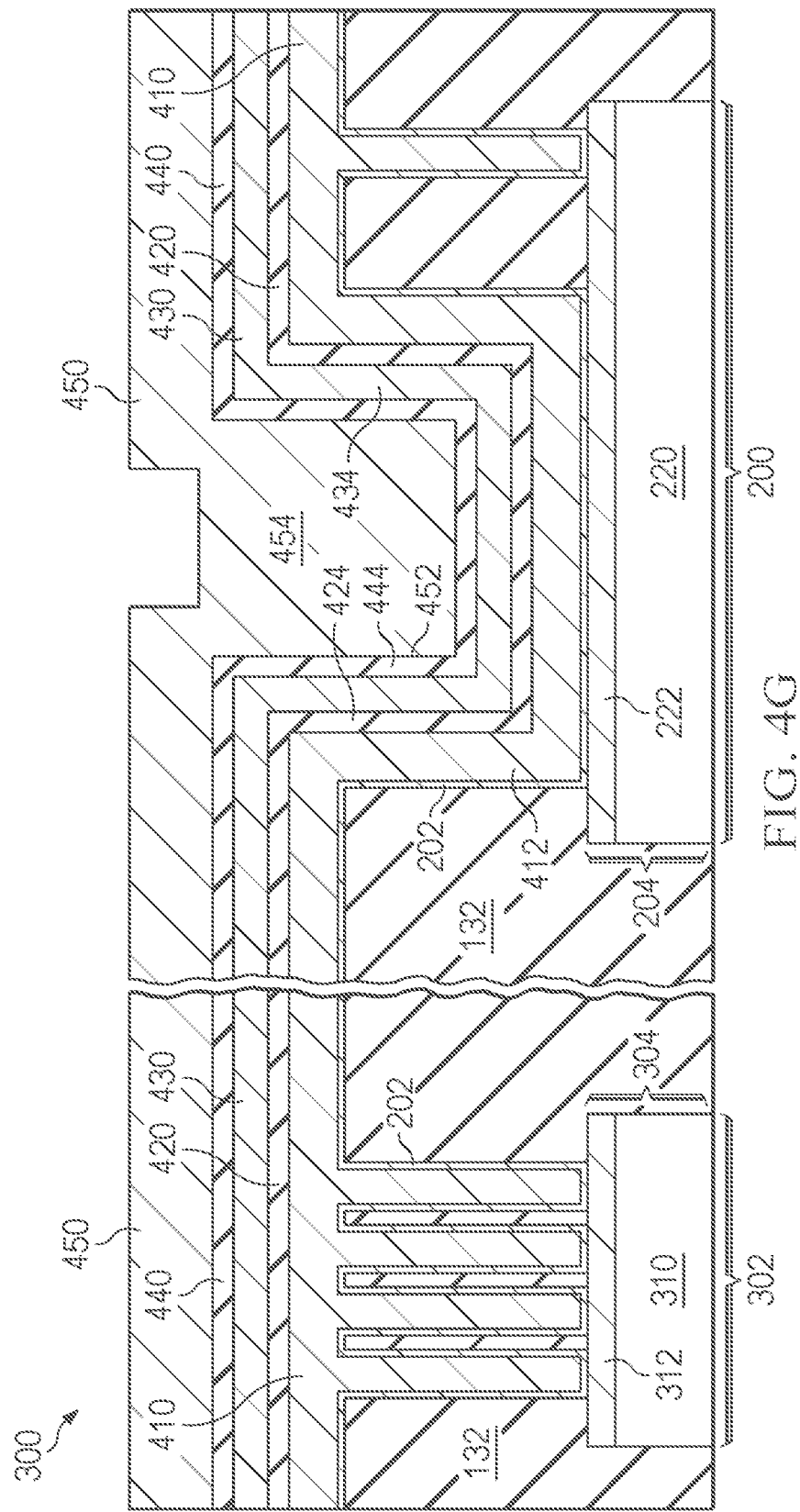

As shown in FIG. 4G, a third electrode metal 450 is deposited over the second insulator layer 440 and extends down into an opening 452 defined by the second insulator cup structure 444 to form a third electrode structure 454 partially or completely filling the opening 452. In some examples, the third electrode metal 450 comprises TiN or TiN combined with tungsten, deposited by CVD or PVD, for example. In other examples, the third electrode metal 450 may comprise aluminum, e.g., formed in the opening 452 by an aluminum re-flow process. Using aluminum for the third electrode metal 450 may provide a third electrode 118 exhibiting low resistance, and with little or no risk of hillock formation due to the third electrode metal 450 being formed on the second insulator layer 440. Alternatively, the third electrode metal 450 may comprise a tantalum/tantalum nitride bilayer (Ta/TaN), followed by copper deposition.

Figure 4H:
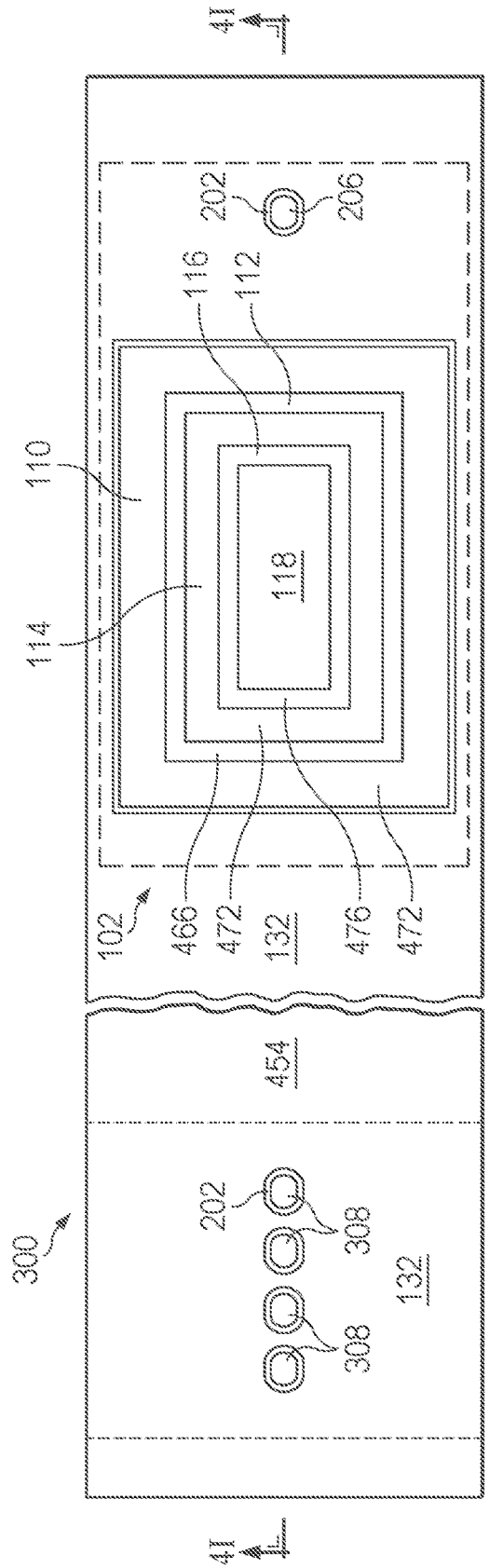
Figure 4I:
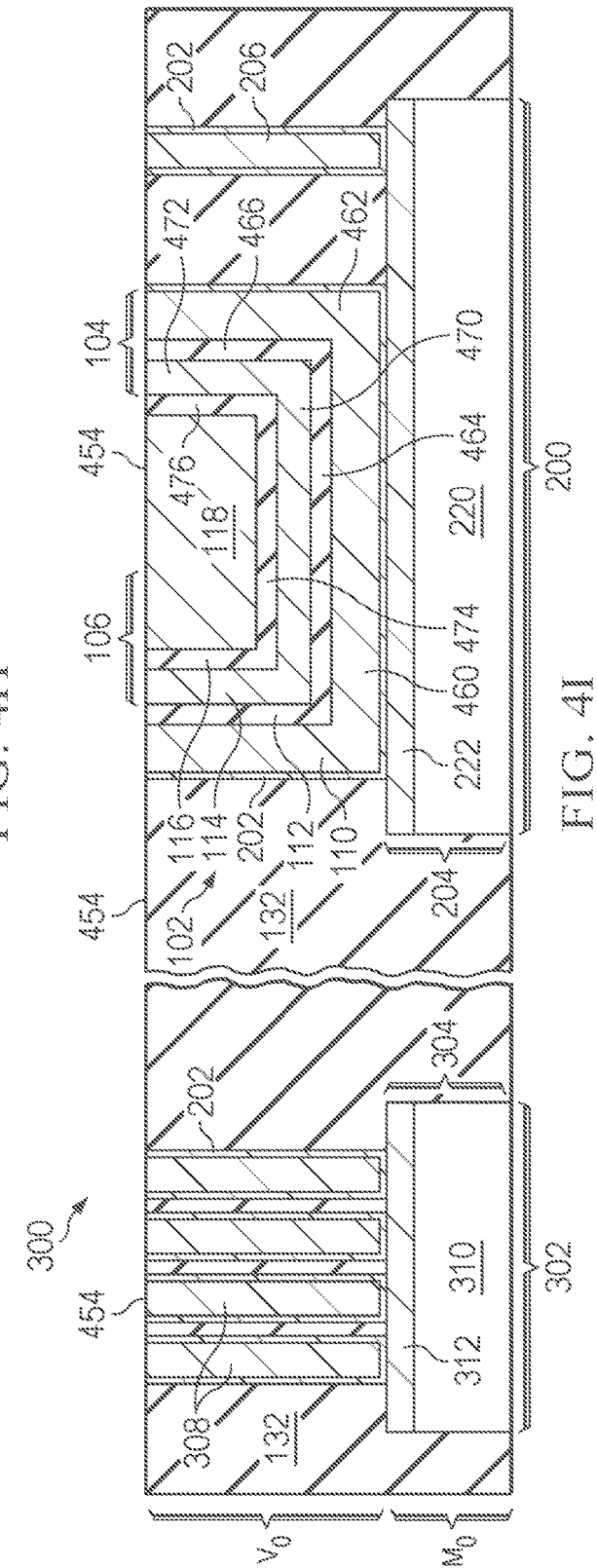

As shown in FIG. 4H (top view) and FIG. 4I (cross-sectional side view through line 4I-4I shown in FIG. 4H), a planarization process is performed to remove (a) upper portions of the third electrode metal 450, (b) upper portions of the second insulator layer 440, (c) upper portions of the second conformal metal 430, (d) upper portions of the first insulator layer 420, and (e) upper portions of the first conformal metal 410, resulting in the structure shown in FIGS. 4H and 4I. The planarization process defines a planarized upper surface 454 of via layer $V_0$. In some examples the planarization process comprises a chemical mechanical planarization (CMP) process.

After the planarization process, a remaining portion of the first conformal metal 410 defines the cup-shaped first electrode 110, a remaining portion of the first insulator layer 420 defines the cup-shaped first insulator 112, a remaining portion of the second conformal metal 430 defines the cup-shaped second electrode 114, a remaining portion of the second insulator layer 440 defines the cup-shaped second insulator 116, and a remaining portion of the third electrode metal 450 defines the third electrode 118.

The cup-shaped first electrode 110 includes a laterally-extending first electrode base 460 and a vertically-extending first electrode sidewall 462 extending upwardly from the laterally-extending first electrode base 460, e.g., from a perimeter of laterally-extending first electrode base 460. As shown in FIG. 4H, in a horizontal plane (x-y plane) the vertically-extending first electrode sidewall 462 may have a closed-loop rectangular perimeter surrounding the cup-shaped first insulator 112, and surrounded by dielectric region 132.

The cup-shaped first insulator 112 includes a laterally-extending first insulator base 464 and a vertically-extending first insulator sidewall 466 extending upwardly from the laterally-extending first insulator base 464, e.g., from a perimeter of laterally-extending first insulator base 464. As shown in FIG. 4H, in a horizontal plane (x-y plane) the vertically-extending first insulator sidewall 466 may have a closed-loop rectangular perimeter surrounding the cup-shaped second electrode 114.

The cup-shaped second electrode 114 includes a laterally-extending second electrode base 470 and a vertically-extending second electrode sidewall 472 extending upwardly from the laterally-extending second electrode base 470, e.g., from a perimeter of laterally-extending second electrode base 470. As shown in FIG. 4H, in a horizontal plane (x-y plane) the vertically-extending second electrode sidewall 472 may have a closed-loop rectangular perimeter surrounding the cup-shaped second insulator 116.

The cup-shaped second insulator 116 includes a laterally-extending second insulator base 474 and a vertically-extending second insulator sidewall 476 extending upwardly from the laterally-extending second insulator base 474 e.g., from a perimeter of laterally-extending second electrode base second insulator base 474. As shown in FIG. 4H, in a horizontal plane (x-y plane) the vertically-extending second insulator sidewall 476 may have a closed-loop rectangular perimeter surrounding the third electrode 118.

As discussed above, the cup-shaped first electrode 110, the cup-shaped second electrode 114, and the cup-shaped first insulator 112 define the first capacitor 104, and the cup-shaped second electrode 114, the third electrode 118, and the cup-shaped second insulator 116 define the second capacitor 106. As shown, the second capacitor 106 is physically nested in the first capacitor 104.

Figure 4J:
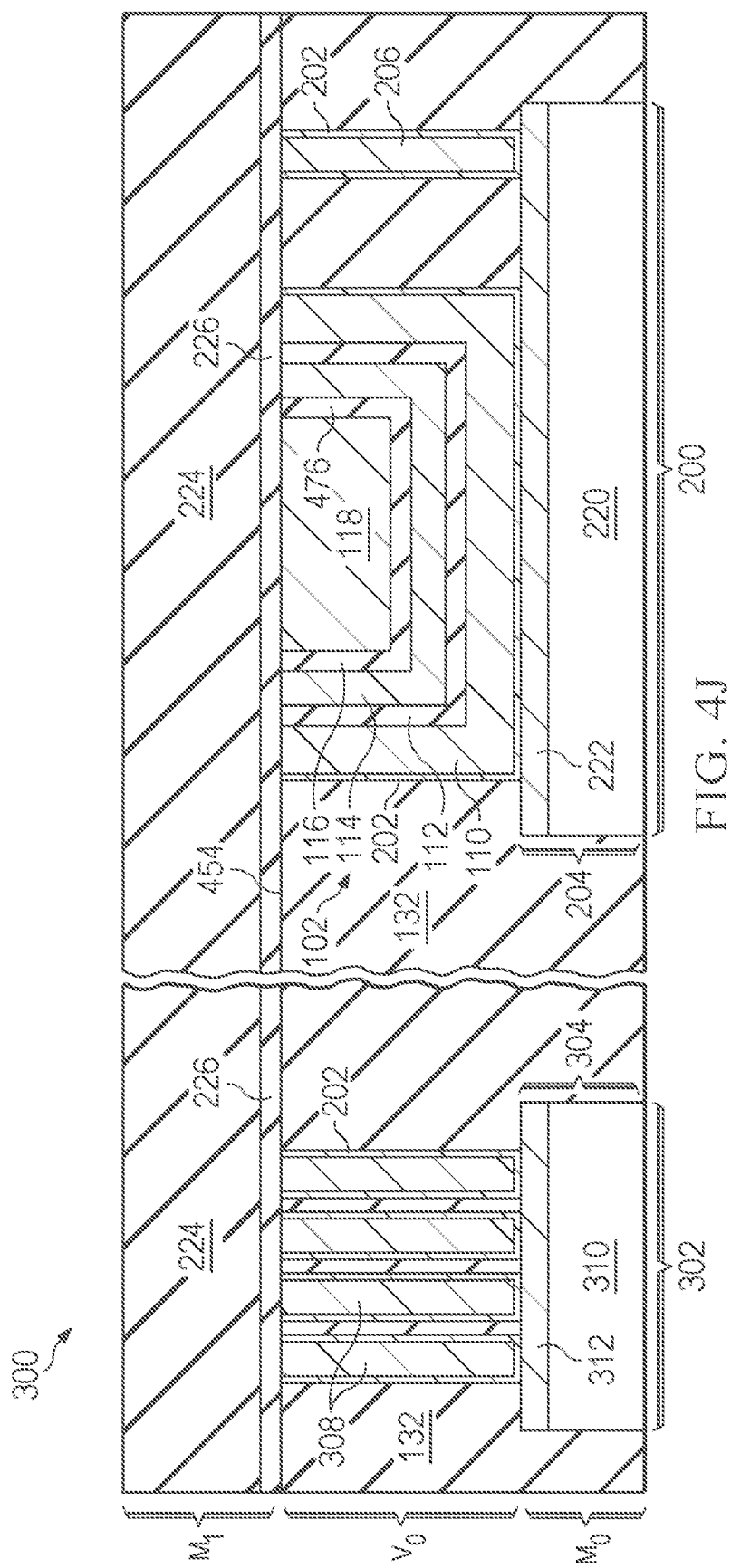
Figure 4K:
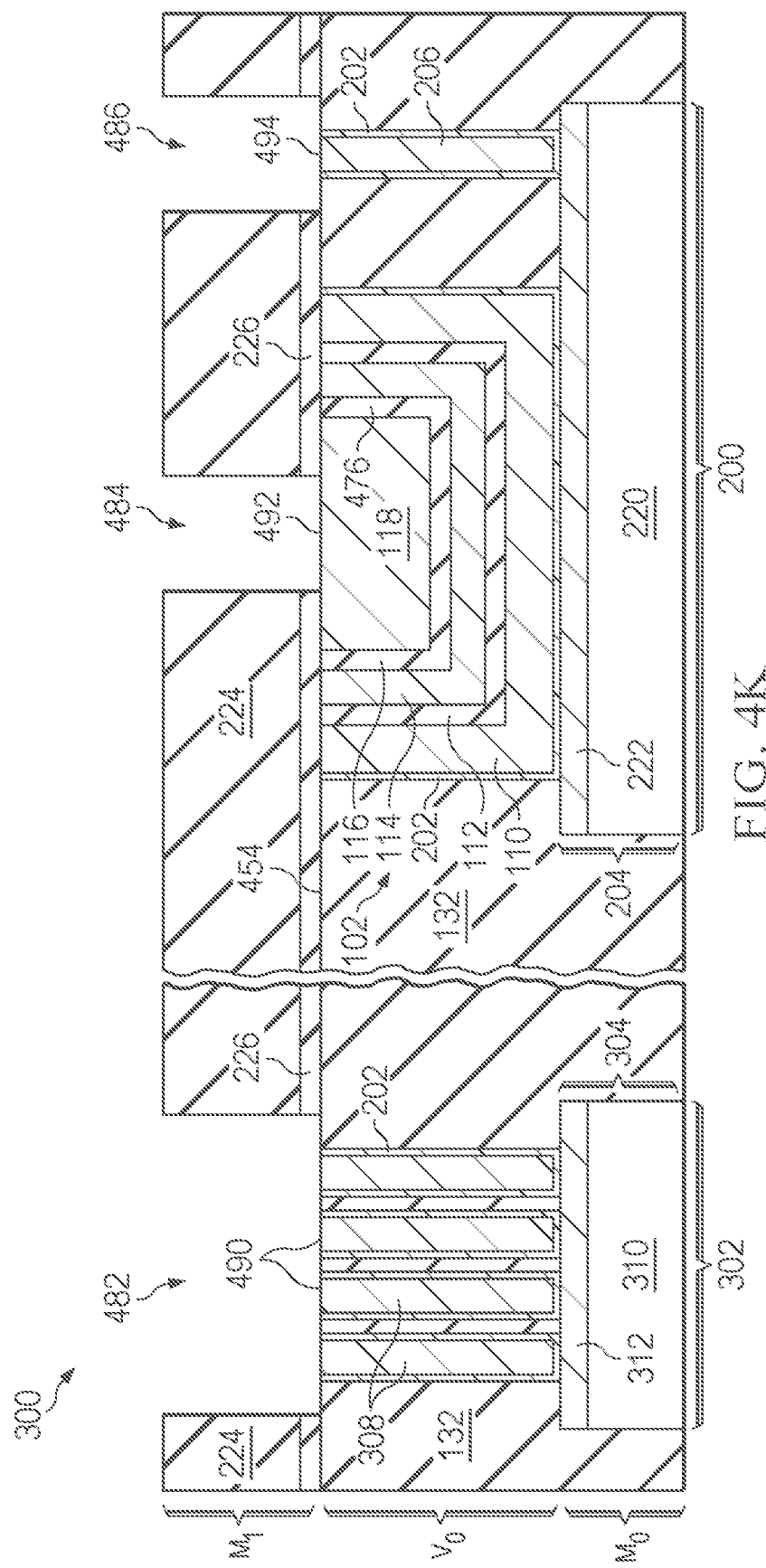
Figure 4L:
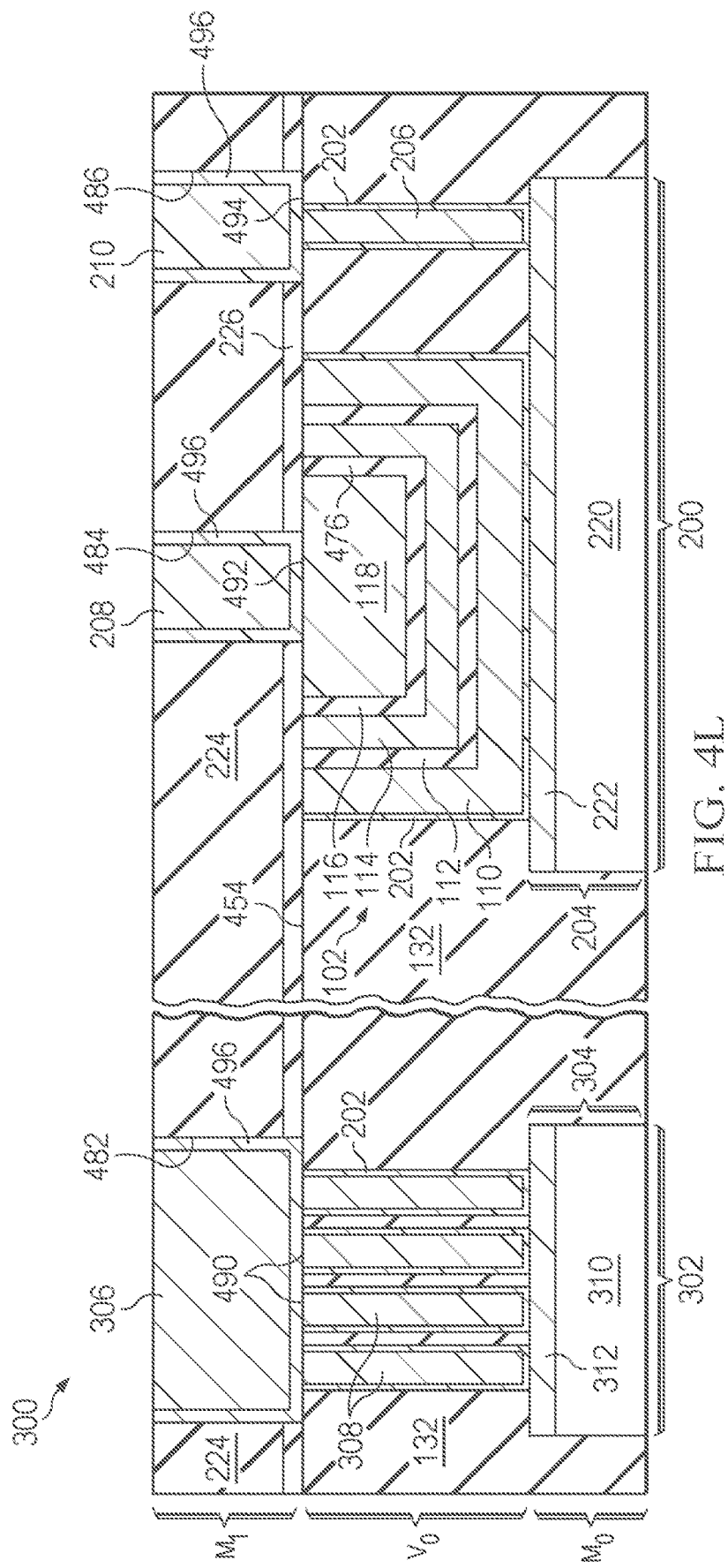

After the planarization process, the upper IC element 306, third electrode connection element 208, and first electrode connection element 210 are formed concurrently in upper metal layer $M_1$, e.g., using a damascene process shown in FIGS. 4J-4L.

As shown in FIG. 4J, the dielectric etch stop layer 226 is deposited on the planarized upper surface 454. In some examples, the dielectric etch stop layer 226 may comprise SiN or SiC with a thickness in the range of 250-750 Å. The dielectric etch stop layer 226 acts as an etch stop for an etch shown in FIG. 4K and discussed below. The dielectric etch stop layer 226 may also function to terminate fringe electric fields generated by the multi-capacitor module 200. The dielectric etch stop layer 226 may also serve as diffusion barrier if copper is used for the third electrode 118.

The dielectric region 224 is formed over the dielectric etch stop layer 226. In some examples, the dielectric region 224 may comprise silicon oxide, fluorinated silicate glass (FSG), organosilicate glass (OSG), or porous OSG.

As shown in FIG. 4K, an upper IC element opening 482, a third electrode connection element opening 484, and a first electrode connection element opening 486 are patterned and etched in the dielectric region 224. The dielectric etch stop layer 226 may control the depth of the etch, e.g., to stop the etch just below the dielectric etch stop layer 226. The etched upper IC element opening 482 may expose upper surfaces 490 of respective vertically-extending IC contact elements 308. The etched third electrode connection element opening 484 may expose an upper surface 492 of the third electrode 118. The etched first electrode connection element opening 486 may expose an upper surface 494 of the vertically-extending first electrode contact 206.

As shown in FIG. 4L, a barrier layer (e.g., comprising Ta/TaN) and a copper seed layer, collectively indicated at 496, may be deposited in the upper IC element opening 482, third electrode connection element opening 484, and first electrode connection element opening 486, followed by a copper plating process, a copper anneal process, and a copper CMP process to form the upper IC element 306, third electrode connection element 208, and first electrode connection element 210 in the upper metal layer $M_1$. In other examples, the upper IC element 306, third electrode connection element 208, and first electrode connection element 210 may be formed from aluminum or other suitable metal.

FIG. 5A is a cross-sectional side view of an IC device 500 including an example multi-capacitor module 502 formed concurrently with an example IC structure 504, wherein the multi-capacitor module 502 includes a the nested MIM capacitor structure 506 formed in a via layer $V_0$ between a shallow trench isolation (STI) oxide region 508 and a first metal interconnect layer $M_1$ (metal-1). FIG. 5B is a cross-sectional top view of the nested MIM capacitor structure 506 through line 5B-5B shown in FIG. 5A.

The nested MIM capacitor structure 506 of the example multi-capacitor module 502 includes a cup-shaped first electrode 510, a cup-shaped first insulator 512, a cup-shaped second electrode 514, a cup-shaped second insulator 516, and a third electrode 518. The cup-shaped first electrode 510 may be formed over a liner (e.g., TiN liner) 520, which may be deposited directly on the STI oxide region 508. The multi-capacitor module 502 may also include a third electrode connection element 540 and a first electrode connection element 542 formed in the first metal interconnect layer $M_1$. The third electrode connection element 540 is electrically connected to the third electrode 518, and the first electrode connection element 542 is electrically connected to the cup-shaped first electrode 510 through a lateral contact extension 530 projecting from the cup-shaped first electrode 510, as discussed below.

The cup-shaped first electrode 510 may include a laterally-extending first electrode base 532 and a vertically-extending first electrode sidewall 534 extending upwardly from the laterally-extending first electrode base 532. As shown in FIGS. 5A and 5B, the lateral contact extension 530 projects laterally from the vertically-extending first electrode sidewall 534. The lateral contact extension 530 may provide electrical connection between the overlying first electrode connection element 542 and the cup-shaped first electrode 510. In some examples, the lateral contact extension 530 may be formed concurrently with the cup-shaped first electrode 510, e.g., by depositing tungsten or other conformal metal into a tub opening including a lateral extension projecting from a lateral side of the tub opening.

In this example, the IC structure 504 includes a transistor 550 including a doped source region 552 having a metal silicide region 554 formed thereon, a doped drain region 556 having a metal silicide region 558 formed thereon, and a polysilicon gate 560 having a metal silicide region 562 formed thereon. The IC structure 504 may include respective vertically-extending IC contacts 564 electrically connected to the metal silicide region 554, metal silicide region 558, and metal silicide region 562, and respective upper IC elements 566 formed in the first metal interconnect layer $M_1$ (metal-1) and electrically connected to respective vertically-extending IC contacts 564.

FIG. 6 is a cross-sectional side view of an example IC device 600 including an example multi-capacitor module 602 including the nested MIM capacitor structure 102, formed between two metal interconnect layers $M_x$ and $M_{x+1}$, and an example interconnect structure 604. The example IC device 600 may be similar to the example IC device 300 shown in FIG. 3 and FIGS. 4A-4L, but wherein the first electrode base 204 and the lower IC element 304 comprise metal elements (e.g., aluminum elements) formed in the lower metal interconnect layer $M_x$. The multi-capacitor module 602 may be formed at any depth in the relevant IC device structure.

In the example multi-capacitor modules shown in the drawings and discussed above, the nested MIM capacitor structures include two capacitors arranged in a nested manner. In other examples, the multi-capacitor module may include three, four, or more nested capacitors formed in the nested MIM capacitor structure, e.g., by depositing additional insulator layers and electrode layers (e.g., additional cup-shaped insulator layers and cup-shaped electrode layers) in an alternating manner in the tub opening.

The invention claimed is:

1. A method, comprising:
   forming a tub opening in a dielectric region;
   depositing a first conformal metal extending into the tub opening;
   depositing a first insulator layer extending into an opening defined by the first conformal metal;
   depositing a second conformal metal extending into an opening defined by the first insulator layer;
   depositing a second insulator layer extending into an opening defined by the second conformal metal;
   depositing a third electrode metal extending into an opening defined by the second insulator layer; and
   performing a planarization process defining a nested metal-insulator-metal (MIM) structure in the tub opening;

wherein after the planarization process:
  a remaining portion of the first insulator layer defines a first insulator;
  a remaining portion of the second conformal metal defines a second electrode;
  a remaining portion of the second insulator layer defines a second insulator; and
  a remaining portion of the third electrode metal defines a third electrode;
  wherein the first electrode, the second electrode, and the first insulator define a first capacitor; and
  wherein the second electrode, the third electrode, and the second insulator define a second capacitor electrically connected in series with the first capacitor;
  forming a first electrode connection element electrically connected to the first electrode; and
  forming a third electrode connection element electrically connected to the third electrode;
  wherein the third electrode connection element is electrically insulated from the first electrode connection element.

2. The method of claim 1, wherein the planarization process includes removing portions of the first conformal metal, portions of the first insulator layer, portions of the second conformal metal, portions of the second insulator layer, and portions of the third electrode metal.

3. The method of claim 1, comprising:
  forming a first electrode base in a lower metal layer;
  forming the dielectric region over the lower metal layer;
  wherein the tub opening is formed over the first electrode base; and
  forming the third electrode connection element in an upper metal layer over the dielectric region.

4. The method of claim 3, wherein the lower metal layer comprises a silicided polysilicon layer, and wherein the first electrode base comprises a metal silicide region formed on a polysilicon structure.

5. The method of claim 3, wherein the lower metal layer and upper metal layer comprise respective metal interconnect layers.

6. The method of claim 3, comprising:
  forming a first electrode contact opening in the dielectric region;
  wherein the deposited first conformal metal extends into the first electrode contact opening;
  wherein after the planarization process, a remaining portion of the first conformal metal in the first electrode contact opening defines a first electrode contact electrically connected to the first electrode base; and
  forming the first electrode connection element in the upper metal layer, wherein the first electrode connection element is electrically connected to the first electrode contact.

7. The method of claim 1, comprising:
  forming the dielectric region over a shallow trench isolation (STI) oxide;
  wherein the tub opening exposes an upper surface of the STI oxide; and
  wherein the first conformal metal is deposited on the exposed upper surface of the STI oxide.

8. The method of claim 1, comprising:
  forming a first electrode base and a lower integrated circuit (IC) element in a lower metal layer;
  wherein the dielectric region is formed over the lower metal layer;
  forming an IC contact element opening in the dielectric region;
  wherein the deposited first conformal metal fills the IC contact element opening; and
  wherein a portion of the first conformal metal in the IC contact element opening after the planarization process defines an IC contact element;
  wherein after the planarization process, a remaining portion of the first conformal metal in the IC contact element opening after the planarization process defines a vertically-extending IC contact element electrically connected to the lower IC element; and
  forming an upper IC element and a third electrode connection in the upper metal layer, wherein the upper IC element is electrically connected to the vertically-extending IC contact element, and wherein the third electrode connection element is electrically connected to the third electrode.

9. A device formed by a process comprising:
  forming a tub opening in a dielectric region;
  depositing a first conformal metal extending into the tub opening;
  depositing a first insulator layer extending into an opening defined by the first conformal metal;
  depositing a second conformal metal extending into an opening defined by the first insulator layer;
  depositing a second insulator layer extending into an opening defined by the second conformal metal;
  depositing a third electrode metal extending into an opening defined by the second insulator layer; and
  performing a planarization process defining a nested metal-insulator-metal (MIM) structure in the tub opening;
  wherein after the planarization process:
  a remaining portion of the first insulator layer defines a first insulator;
  a remaining portion of the second conformal metal defines a second electrode;
  a remaining portion of the second insulator layer defines a second insulator; and
  a remaining portion of the third electrode metal defines a third electrode;
  wherein the first electrode, the second electrode, and the first insulator define a first capacitor; and
  wherein the second electrode, the third electrode, and the second insulator define a second capacitor electrically connected in series with the first capacitor;
  forming a first electrode connection element electrically connected to the first electrode;
  and forming a third electrode connection element electrically connected to the third electrode;
  wherein the third electrode connection element is electrically insulated from the first electrode connection element.

10. The device of claim 9, wherein the lower metal layer comprises a silicided polysilicon layer, and wherein the first electrode base comprises a metal silicide region formed on a polysilicon structure.

11. The device of claim 9, wherein the lower metal layer and upper metal layer comprise respective metal interconnect layers.

* * * * *